United States Patent
Koo

(10) Patent No.: US 11,037,963 B2
(45) Date of Patent: Jun. 15, 2021

(54) THIN FILM TRANSISTOR AND METHOD FOR MANUFACTURING THE SAME, AND DISPLAY DEVICE INCLUDING THE SAME

(71) Applicant: LG Display Co., Ltd., Seoul (KR)

(72) Inventor: HyungJoon Koo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/012,653

(22) Filed: Sep. 4, 2020

(65) Prior Publication Data

US 2020/0403011 A1    Dec. 24, 2020

Related U.S. Application Data

(62) Division of application No. 15/855,053, filed on Dec. 27, 2017.

(30) Foreign Application Priority Data

Dec. 30, 2016  (KR) .......................... 10-2016-0183661

(51) Int. Cl.
  *H01L 27/12*    (2006.01)
  *H01L 29/786*   (2006.01)
  (Continued)

(52) U.S. Cl.
  CPC .... *H01L 27/1251* (2013.01); *H01L 21/02175* (2013.01); *H01L 21/02178* (2013.01); *H01L 21/02186* (2013.01); *H01L 21/02194* (2013.01); *H01L 21/02244* (2013.01); *H01L 27/127* (2013.01); *H01L 27/1225* (2013.01);
  (Continued)

(58) Field of Classification Search
  None
  See application file for complete search history.

(56) References Cited

U.S. PATENT DOCUMENTS 5,217,921 A *  6/1993  Kaido ................... H01L 31/046
                                                       257/E27.125
8,148,779 B2    4/2012  Jeong et al.
(Continued)

FOREIGN PATENT DOCUMENTS

| CN | 101764065 A | 6/2010 |
|---|---|---|
| CN | 101859710 A | 10/2010 |
| WO | 2016/197526 A1 | 12/2016 |

OTHER PUBLICATIONS

Chinese Office Action dated Jul. 20, 2020 issued in corresponding Patent Application No. 201711362575.8 w/partial translation (20 pages).

*Primary Examiner* — Nishath Yasmeen
(74) *Attorney, Agent, or Firm* — Polsinelli PC

(57) ABSTRACT

A thin film transistor and a method for manufacturing the same, and a display device including the same are disclosed, in which a P type semiconductor characteristic is realized using an active layer that includes a Sn based oxide. The thin film transistor comprises an active layer that includes an Sn(II)O based oxide; a metal oxide layer being in contact with one surface of the active layer; a gate electrode overlapped with the active layer; a gate insulating film provided between the gate electrode and the active layer; a source electrode being in contact with a first side of the active layer; and a drain electrode being in contact with a second side of the active layer.

20 Claims, 18 Drawing Sheets

(51) Int. Cl.
  *H01L 29/66* (2006.01)
  *H01L 29/49* (2006.01)
  *H01L 29/24* (2006.01)
  *H01L 21/02* (2006.01)

(52) U.S. Cl.
  CPC .......... *H01L 27/1229* (2013.01); *H01L 29/24* (2013.01); *H01L 29/4908* (2013.01); *H01L 29/66969* (2013.01); *H01L 29/7869* (2013.01); *H01L 29/78606* (2013.01); *H01L 29/78696* (2013.01)

(56) References Cited

U.S. PATENT DOCUMENTS

| | | |
|---|---|---|
| 8,293,595 B2 | 10/2012 | Yamazaki et al. |
| 8,461,594 B2 | 6/2013 | Morosawa et al. |
| 9,184,090 B2 | 11/2015 | Choi et al. |
| 2008/0038882 A1* | 2/2008 | Takechi ............ H01L 21/02587 438/151 |
| 2010/0252832 A1 | 10/2010 | Asano et al. |
| 2010/0258802 A1 | 10/2010 | Godo et al. |
| 2011/0309356 A1 | 12/2011 | Yabuta et al. |
| 2013/0122649 A1* | 5/2013 | Zhang ................ H01L 29/7869 438/104 |
| 2014/0011329 A1* | 1/2014 | Zhang ............... H01L 29/66969 438/158 |
| 2015/0325605 A1 | 11/2015 | Liu et al. |
| 2016/0035753 A1 | 2/2016 | Liu et al. |
| 2017/0256421 A1* | 9/2017 | Liu ........................ H01L 21/44 |
| 2017/0316953 A1* | 11/2017 | Zhang ................ H01L 29/7869 |
| 2018/0174980 A1 | 6/2018 | Wang |

\* cited by examiner

| State | $Sn^{4+}(SnO_2)$ | $Sn^{2+}(SnO)$ |
|---|---|---|
| Gibbs free energy (kJ/mol) | ~ -500 | ~ -250 |

FIG. 7 s-Block

| H | | | | | | | | | | | | | | | | | He | p-Block

| Li | Be | | | | | | | | | | | B | C | N | O | F | Ne |
| Na | Mg | | | | d-Block | | | | | | | Al | Si | P | S | Cl | Ar |
| K | Ca | Sc | Ti | V | Cr | Mn | Fe | Co | Ni | Cu | Zn | Ga | Ge | As | Se | Br | Kr |
| Rb | Sr | Y | Zr | Nb | Tc | Tc | Ru | Rh | Pd | Ag | Cd | In | Sn | Sb | Te | I | Xe |
| Cs | Ba | | Hf | Ta | W | Re | Os | Ir | Pt | Au | Hg | Ti | Pb | Bi | Po | At | Rn |
| Fr | Ra | | Rf | Db | Sg | Bh | Hs | Mt | Ds | Rg | Cn | Uut | Fl | Uup | Lv | Uus | Uuo | f-Block

| La | Ce | Pr | Nd | Pm | Sm | Eu | Gd | Tb | Dy | Ho | Er | Tm | Yb | Lu |
| Ac | Th | Pa | U | Np | Pu | Am | Cm | Bk | Cf | Es | Fm | Md | No | Lr |

|   | Sn²⁺ peak | | | |
|---|---|---|---|---|
|   | 200 °C | | 300 °C | |
| A | 484.5 | 492.9 | 484.5 | 492.9 |
| B | 484.7 | 493.1 | 484.6 | 493.0 |
| C | - | - | 484.4 | 492.8 |
| D | - | - | 484.3 | 492.7 |

|   | $Sn^{2+}$ peak | | | |
|---|---|---|---|---|
|   | 200 °C | | 300 °C | |
| A | 484.5 | 493.1 | 484.6 | 493.0 |
| B | 484.5 | 493.1 | 484.6 | 493.1 |
| C | - | - | 484.6 | 493.1 |
| D | - | - | 484.6 | 493.0 |

THIN FILM TRANSISTOR AND METHOD FOR MANUFACTURING THE SAME, AND DISPLAY DEVICE INCLUDING THE SAME

CROSS REFERENCE TO RELATED APPLICATION

This application is a divisional of U.S. patent application Ser. No. 15/855,053 filed Dec. 27, 2017, which claims the benefit of the Korean Patent Application No. 10-2016-0183661 filed on Dec. 30, 2016, all of which are hereby incorporated by reference in their entireties for all purposes as if fully set forth herein.

BACKGROUND

Field of the Disclosure

The present disclosure relates to a display device, and more particularly, to a thin film transistor and a method for manufacturing the same, and a display device including the same.

Description of the Background

Recently, with the advent of the information age, a demand for a display device for displaying an image has been increased in various forms. Therefore, various flat panel display devices such as liquid crystal display (LCD) devices, plasma display panel (PDP) devices, and organic light emitting display (OLED) devices have been used.

The flat panel display device such as the liquid crystal display device and the organic light emitting display device includes a display panel, a gate driving circuit, a data driving circuit, and a timing controller. More specifically, the display panel includes data lines, gate lines, and a plurality of pixels formed at crossing portions of the data lines and the gate lines, receiving data voltages of the data lines when gate signals are supplied to the gate lines. The pixels emit light at a predetermined brightness in accordance with the data voltages.

Also, the flat panel display device is a switching device, and drives the pixels and the gate driving circuit using a thin film transistor. The thin film transistor may be a metal oxide semiconductor field effect transistor (MOSFET, hereinafter, referred to as "oxide semiconductor transistor") that controls a flow of a current by means of an electric field.

In the gate driving circuit or data driving circuit of the flat panel display device, a complementary metal oxide semiconductor (CMOS), which is an inverter, may be used to properly output a signal input from the outside source. The CMOS requires both an N type oxide semiconductor transistor and a P type oxide semiconductor transistor.

However, an indium gallium zinc oxide (IGZO) based oxide semiconductor transistor has N type semiconductor characteristic as shown in FIG. 1, but does not have P type semiconductor characteristic. Therefore, it is difficult to form a thin film transistor having P type semiconductor characteristic by using the IGZO based oxide semiconductor transistor.

Also, an Sn based oxide may exist as $Sn(IV)O_2$ and $Sn(II)O_2$. $Sn(IV)O_2$ has an N type semiconductor characteristic, and $Sn(II)O$ has a P type semiconductor characteristic. However, as shown in FIG. 2, since Gibbs free energy of $Sn(IV)O_2$ is lower than that of $Sn(II)O$, $Sn(II)O$ can be easily transited to $Sn(IV)O_2$ having low Gibbs free energy. Therefore, it is not easy to form a thin film transistor having a P type semiconductor characteristic by using Sn based oxide semiconductor transistor.

SUMMARY

Accordingly, the present disclosure is directed to a thin film transistor and a method for manufacturing the same, and a display device including the same, which substantially obviate one or more problems due to limitations and disadvantages of the related art.

An advantage of the present disclosure is to provide a thin film transistor and a method for manufacturing the same, and a display device including the same, in which a P type semiconductor characteristic is realized using an active layer that includes a Sn based oxide.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a thin film transistor comprising an active layer that includes an $Sn(II)O$ based oxide; a metal oxide layer being in contact with one surface of the active layer; a gate electrode overlapped with the active layer; a gate insulating film provided between the gate electrode and the active layer; a source electrode being in contact with a first side of the active layer; and a drain electrode being in contact with a second side of the active layer.

In another aspect of the present disclosure, there is provided a method for manufacturing a thin film transistor, which comprises the steps of forming a gate electrode and forming a gate insulating film covering the gate electrode; forming an active layer on the gate insulating film; forming a reactive metal layer on the active layer; forming the active layer as an $Sn(II)O$ based oxide semiconductor layer and forming the reactive metal layer as a metal oxide layer by heat-treating the active layer and the reactive metal layer; and forming a source electrode which is in contact with a first side of the active layer and a drain electrode which is in contact with a second side of the active layer.

In other aspect of the present disclosure, there is provided a display device comprising a first thin film transistor having P type semiconductor characteristic; and a second thin film transistor having N type semiconductor characteristic, wherein the first thin film transistor includes a first active layer having an $Sn(II)O$ based oxide, and the second thin film transistor includes a second active layer having an $Sn(IV)O_2$ based oxide.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings:

FIG. 7 is a table illustrating a periodic table of elements;

DETAILED DESCRIPTION

Figures 1, 2:
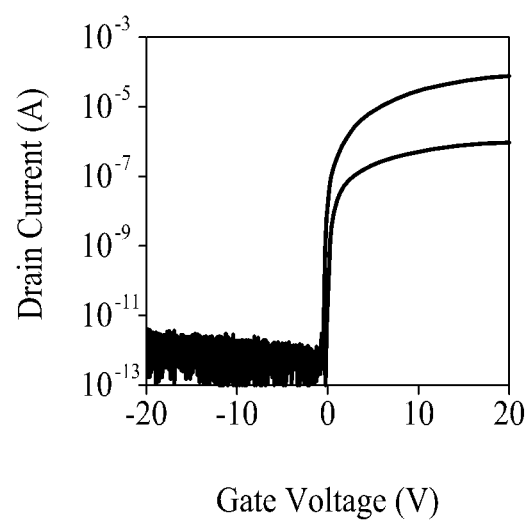
FIG. 1 is a graph illustrating semiconductor characteristic of an IGZO based oxide semiconductor transistor.
FIG. 2 is a table illustrating Gibbs free energy of each of $Sn(IV)O_2$ and $Sn(II)O$.

The same reference numbers substantially mean the same elements through the specification. In the following description of the present disclosure, if detailed description of elements or functions known in respect of the present disclosure is not relevant to the subject matter of the present disclosure, the detailed description will be omitted. The terms disclosed in this specification should be understood as follows.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. Therefore, a first element could be termed a second element, and, similarly, a second element could be termed a first element, without departing from the scope of the present disclosure.

"X-axis direction", "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the preferred aspects of the present disclosure will be described in detail with reference to the accompanying drawings.

Figure 3:
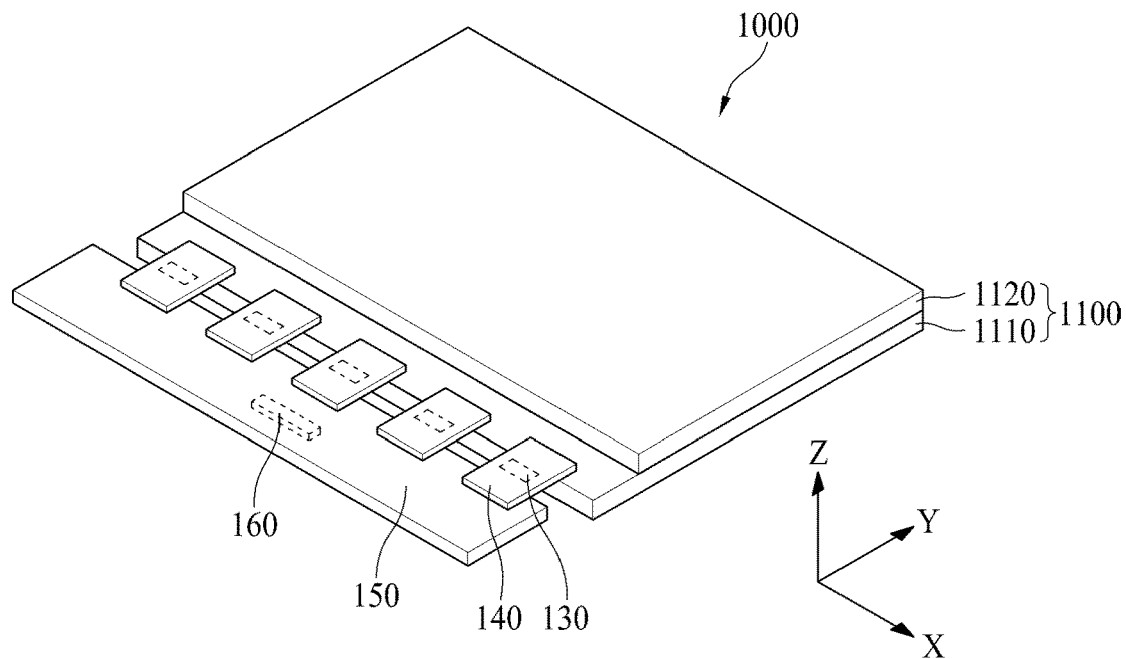
FIG. 3 is a perspective view illustrating a display device according to an aspect of the present disclosure.
Figure 4:
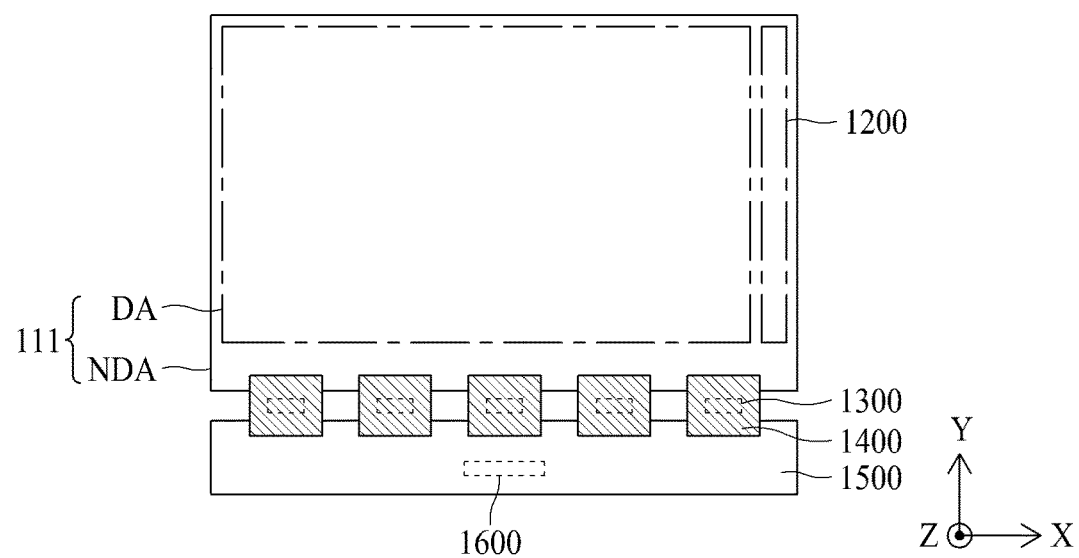
FIG. 4 is a plane view illustrating a first substrate, a gate driver, a source drive IC, a flexible film, a circuit board, and a timing controller of FIG. 3.

FIG. 3 is a perspective view illustrating a display device according to one aspect of the present disclosure. FIG. 4 is a plane view illustrating a first substrate, a gate driver, a source drive IC, a flexible film, a circuit board, and a timing controller of FIG. 3.

Referring to FIGS. 3 and 4, an organic light emitting display device 1000 according to one aspect of the present disclosure includes a display panel 1100, a gate driver 1200, a source drive integrated circuit (hereinafter, referred to as "IC") 1300, a flexible film 1400, a circuit board 1500, and a timing controller 1600. The display device according to one aspect of the present disclosure may be realized as any one of a liquid crystal display device, an organic light emitting display device, a field emission display device and an electrophoresis display device.

The display panel 1100 includes a first substrate 1110 and a second substrate 1120. The second substrate 1120 may be an encapsulation substrate. Each of the first substrate 1110 and the second substrate 1120 may be a plastic film or a glass.

Gate lines, data lines and pixels P are formed on one surface of the first substrate 1110, which faces the second substrate 1120. The pixels P are provided in an area defined by a crossing structure of the gate lines and the data lines.

The display panel 1100 may be categorized into a display area DA where the pixels are formed to display an image and a non-display area NDA where an image is not displayed, as shown in FIG. 4. The gate lines, the data lines and the pixels may be formed at the display area DA. The gate driver 1200, pads, and link lines for connecting the data lines with the pads may be formed at the non-display area NDA.

The gate driver 1200 supplies gate signals to the gate lines in accordance with a gate control signal input from the timing controller 1600. The gate driver 1200 may be formed on the non-display area NDA outside one side or both sides of the display area DA of the display panel 1100 in a gate driver in panel (GIP) mode.

The source drive IC 1300 receives digital video data and a source control signal from the timing controller 1600. The source drive IC 1300 converts the digital video data to analog data voltages in accordance with the source control signal and supplies the analog data voltages to the data lines. If the source drive IC 1300 is formed of a driving chip, the source drive IC 1300 may be packaged in the flexible film 1400 in a chip on film (COF) or chip on plastic (COP) mode.

Pads such as data pads may be formed on the non-display area NDA of the display panel 1100. Lines which connect the pads with the source drive IC 1300 and lines which connect the pads with lines of the circuit board 1500 may be formed in the flexible film 1400. The flexible film 1400 may be attached onto the pads by an anisotropic conducting film, whereby the pads may be connected with the lines of the flexible film 1400.

The circuit board 1500 may be attached to the flexible films 1400. A plurality of circuits comprised of driving chips may be packaged in the circuit board 1500. For example, the timing controller 1600 may be packaged in the circuit board 1500. The circuit board 1500 may be a printed circuit board or a flexible printed circuit board.

The timing controller 1600 receives digital video data and a timing signal from an external system board through a cable of the circuit board 1500. The timing controller 1600 generates a gate control signal for controlling an operation timing of the gate driver 1200 and a source control signal for controlling the source drive ICs 1300 on the basis of the timing signal. The timing controller 1600 supplies the gate control signal to the gate driver 1200, and supplies the source control signal to the source drive ICs 1300.

Meanwhile, the pixels P of the display device or the gate driver 1200 may use, for driving, both a thin film transistor having P type semiconductor characteristic and a thin film transistor having an N type semiconductor characteristic.

For example, the pixel P of the organic light emitting display device may include a switching transistor and a driving transistor. The switching transistor may be formed of a thin film transistor having an N type semiconductor characteristic while the driving transistor may be formed of a thin film transistor having a P type semiconductor characteristic. Alternatively, the switching transistor may be formed of a thin film transistor having a P type semiconductor characteristic while the driving transistor may be formed of a thin film transistor having an N type semiconductor characteristic.

Also, the gate driver may include a CMOS (complementary metal oxide semiconductor) circuit to output gate signals. Alternatively, the display device may include a CMOS circuit to output other signals. The CMOS circuit includes a first transistor T1 having a P type semiconductor characteristic and a second transistor T2 having an N type semiconductor characteristic.

A gate electrode of the first transistor T1 and a gate electrode of the second transistor T2 are connected to an input terminal IT. A source electrode of the first transistor T1 is connected to a driving voltage line VDD to which a driving voltage is supplied, and a drain electrode of the first transistor T1 is connected to an output terminal OT. A source electrode of the second transistor T2 is connected to a ground GND, and a drain electrode of the second transistor T2 is connected to the output terminal OT.

If a first logic level voltage is applied to the input terminal IT, the first transistor T1 may be turned on, and the second transistor T2 may be turned off. For this reason, the driving voltage of the driving voltage line VDD may be output to the output terminal OT through the first transistor T1.

If a second logic level voltage higher than the first logic level voltage is applied to the input terminal IT, the second transistor T2 may be turned on, and the first transistor T1 may be turned off. For this reason, since the output terminal OT may be connected to the ground GND through the second transistor T, the output terminal OT may be discharged to a ground voltage.

That is, since the first transistor T1 has a P type semiconductor characteristic, the second transistor T2 has an N type semiconductor characteristic, and the gate electrode of the first transistor T1 and the gate electrode of the second transistor T2 are connected to the gate electrode, the first transistor T1 and the second transistor T2 may be turned on and turned off complementarily with each other.

According to the aspect of the present disclosure, a first thin film transistor that includes an active layer having Sn(II)O based oxide and a second thin film transistor that includes an active layer having $Sn(IV)O_2$ based oxide are provided. Hereinafter, the first and second thin film transistors according to the aspects of the present disclosure will be described in detail with FIGS. 6 to 20.

Figure 6:
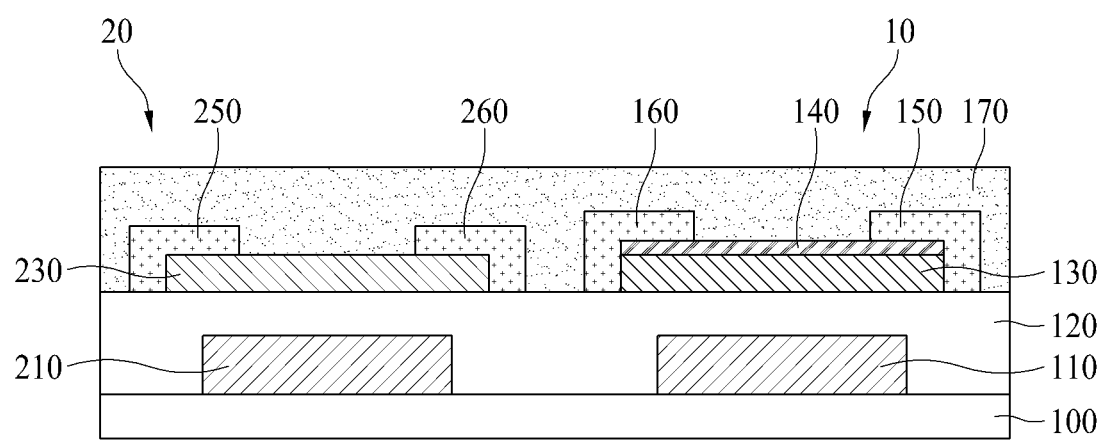
FIG. 6 is a cross-sectional view illustrating first and second thin film transistors according to a first aspect of the present disclosure.

FIG. 6 is a cross-sectional view illustrating first and second thin film transistors according to a first aspect of the present disclosure.

In FIG. 6, first and second thin film transistors 10 and 20 are formed in an inverted staggered structure based on a back channel etched (BCE) process. The inverted staggered structure has a bottom gate structure in which a gate electrode is formed below an active layer.

Referring to FIG. 6, the first thin film transistor 10 according to the first aspect of the present disclosure includes a first gate electrode 110, a first active layer 130, a metal oxide layer 140, a first source electrode 150, and a first drain electrode 160. The second thin film transistor 20 according to the first aspect of the present disclosure includes a second gate electrode 210, a second active layer 230, a second source electrode 250, and a second drain electrode 260.

The first and second thin film transistors 10 and 20 may be formed on a buffer film 100 formed on a substrate. The substrate may be formed of plastic or glass. The buffer film 100 is intended to protect the first and second thin film transistors 10 and 20 from moisture permeated through the substrate. The buffer film 100 may be made of a plurality of inorganic films which are deposited alternately. For example, the buffer film 100 may be formed of a multi-layered film of one or more inorganic films of a silicon oxide film ($SiO_x$), a silicon nitride film ($SiN_x$) and SiON, which are deposited alternately. The buffer film 100 may be omitted, and in this case, the first and second thin film transistors 10 and 20 may be formed on the substrate.

The first and second gate electrodes 110 and 210 are formed on the buffer film 100. The first and second gate electrodes 110 and 210 may be formed of a single layer or multi-layer comprised of any one of Mo, Al, Cr, Au, Ti, Ni, Nd and Cu or their alloy.

A gate insulating film 120 is formed on the first and second gate electrodes 110 and 210. The gate insulating film 120 may be formed of an inorganic film, for example, a silicon oxide film ($SiO_x$), a silicon nitride film ($SiN_x$) or a multi-layered film of the silicon oxide film and the silicon nitride film.

The first and second active layers 130 and 230 are formed on the gate insulating film 120. The first active layer 130 may be arranged to overlap the first gate electrode 110, and the second active layer 230 may be arranged to overlap the second gate electrode 210. For this reason, light entering the first active layer 130 from the substrate may be blocked by the first gate electrode 110, and light entering the second active layer 230 may be blocked by the second gate electrode 210.

The first active layer 130 may be an Sn(II)O based oxide semiconductor layer. That is, the first active layer 130 may be a semiconductor layer that includes an Sn(II)O based oxide. For example, the first active layer 130 may include SnO, Sn-M-$O_x$, Sn-M1-M2-$O_x$, and SnO doped with M. In this case, M, M1, or M2 may be an element of d-Block or an element of p-Block in the periodic table of FIG. 7.

For example, M, M1 or M2 may be, but not limited to, any one of W, B, Nb, Al, Ga, Pb and Si.

The second active layer 230 may be an Sn(IV)$O_2$ based oxide semiconductor layer. That is, the second active layer 230 may be a semiconductor layer that includes an Sn(IV)$O_2$ based oxide. For example, the second active layer 230 may include $SnO_2$, Sn-M-$O_x$, Sn-M1-M2-$O_x$, and $SnO_2$ doped with M. In this case, M, M1, or M2 may be an element of d-Block or an element of p-Block in the periodic table of FIG. 7. For example, M, M1 or M2 may be, but not limited to, any one of W, B, Nb, Al, Ga, Pb and Si.

Since the first active layer 130 is formed of Sn(II)O based oxide semiconductor layer, the first active layer 130 has a P type semiconductor characteristic. By contrast, since the second active layer 230 is formed of an Sn(IV)$O_2$ based oxide semiconductor layer, the second active layer 230 has an N type semiconductor characteristic.

The metal oxide layer 140 is formed on the first active layer 130. The metal oxide layer 140 is an insulating film which is electrically insulated, and may include metal which is likely to generate oxidation. For example, the metal oxide layer 140 may be an aluminum oxide, a titanium oxide, a thallium oxide, or a molybdenum-titanium oxide.

A detailed description of a method for forming the first active layer 130, the second active layer 230 and the metal oxide layer 140 will be described later with reference to FIGS. 8 and 9A to 9F.

Since the metal oxide layer 140 is formed on the first active layer 130, the first source electrode 150 and the first drain electrode 160 are formed on the metal oxide layer 140. For this reason, the first source electrode 150 may be in contact with the first active layer 130 at a first side of the first active layer 130. The first drain electrode 160 may be in contact with the first active layer 130 at a second side of the first active layer 130.

The second source electrode 250 and the second drain electrode 260 are formed on the second active layer 230. The second source electrode 250 may be in contact with the second active layer 230 at a first side of the second active layer 230. The second drain electrode 260 may be in contact with the second active layer 230 at a second side of the second active layer 230.

Figure 5:
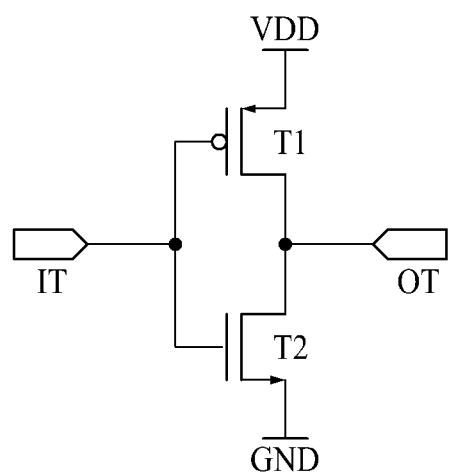
FIG. 5 is a circuit diagram illustrating a CMOS circuit.
Figure 19:
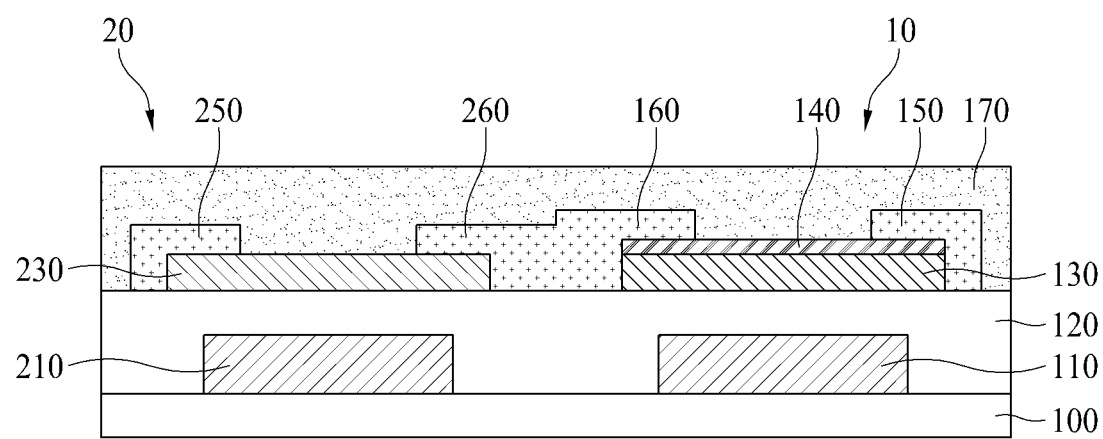
FIG. 19 is a cross-sectional view illustrating first and second thin film transistors according to a seventh aspect of the present disclosure.

The first drain electrode 160 and the second drain electrode 260 may be connected with each other as shown in FIG. 19. In this case, the first and second thin film transistors 10 and 20 may serve as CMOS circuits as shown in FIG. 5.

An inter-layer dielectric film 170 is formed on the first and second source electrodes 150 and 250 and the first and second drain electrodes 160 and 260. The inter-layer dielectric film 170 may be formed of an inorganic film, for example, a silicon oxide film ($SiO_x$), a silicon nitride film ($SiN_x$), or a multi-layered film of the silicon oxide film and the silicon nitride film.

As described above, according to the aspect of the present disclosure, the first thin film transistor 10 that includes a first active layer 130 having Sn(II)O based oxide and the second thin film transistor 20 that includes a second active layer 230 having Sn(IV)$O_2$ based oxide are provided. As a result, according to the aspect of the present disclosure, the first thin film transistor 10 may be realized as a thin film transistor having a P type semiconductor characteristic, and the second thin film transistor 20 may be realized as a thin film transistor having an N type semiconductor characteristic.

Figure 8:
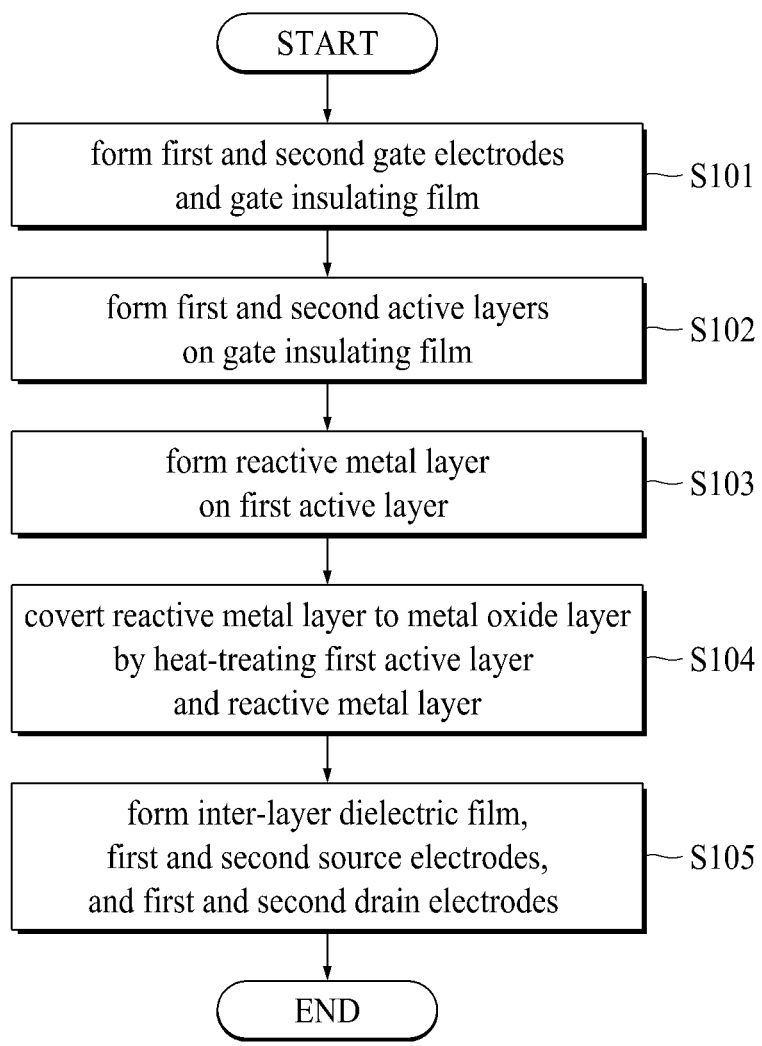
FIG. 8 is a flow chart illustrating a method for manufacturing first and second thin film transistors according to the first aspect of the present disclosure.

FIG. 8 is a flow chart illustrating a method for manufacturing first and second thin film transistors according to the first aspect of the present disclosure. FIGS. 9A to 9F are cross-sectional views illustrating a method for manufacturing first and second thin film transistors according to the first aspect of the present disclosure.

Since the cross-sectional views shown in FIGS. 9A to 9F are intended to describe a method for manufacturing the first and second thin film transistors 10 and 20 shown in FIG. 6, the same reference numerals are given to the same elements. Hereinafter, the method for manufacturing the first and second thin film transistors according to the first aspect of the present disclosure will be described in detail with reference to FIGS. 8 and 9A to 9F.

Figure 9A:
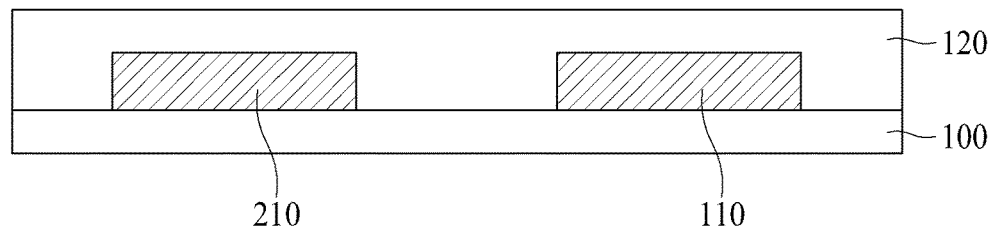
FIGS. 9A to 9F are cross-sectional views illustrating a method for manufacturing first and second thin film transistors according to the first aspect of the present disclosure.

First of all, as shown in FIG. 9A, first and second gate electrodes 110 and 210 and a gate insulating film 120 are formed on a buffer film 100.

The buffer film 100 is intended to protect the first and second thin film transistors 10 and 20 from moisture permeated through the substrate. The buffer film 100 may be made of a plurality of inorganic films which are deposited alternately. For example, the buffer film 100 may be formed of a multi-layered film of one or more inorganic films of a silicon oxide film ($SiO_x$), a silicon nitride film ($SiN_x$) and SiON, which are deposited alternately. The buffer film 100 may be formed using a plasma enhanced chemical vapor deposition (PECVD) method. The buffer film 100 may be omitted.

Then, the first and second gate electrodes 110 and 210 are formed on the buffer film 100. In more detail, a first metal layer may be formed on the entire surface of the buffer film 100 by sputtering. Then, after a photo-resist pattern is formed on the first metal layer, the first metal layer is patterned using a mask process for etching the first metal layer, whereby the first and second gate electrodes 110 and 210 may be formed. The first and second gate electrodes 110 and 210 may be formed of a single layer or multi-layer comprised of any one of Mo, Al, Cr, Au, Ti, Ni, Nd and Cu or their alloy.

Then, a gate insulating film 120 is formed on the first and second gate electrodes 110 and 210. The gate insulating film 120 may be formed to cover the first and second gate electrodes 110 and 210. The gate insulating film 120 may be formed of an inorganic film, for example, a silicon oxide film ($SiO_x$), a silicon nitride film ($SiN_x$) or a multi-layered film of the silicon oxide film and the silicon nitride film.

Figure 9B:
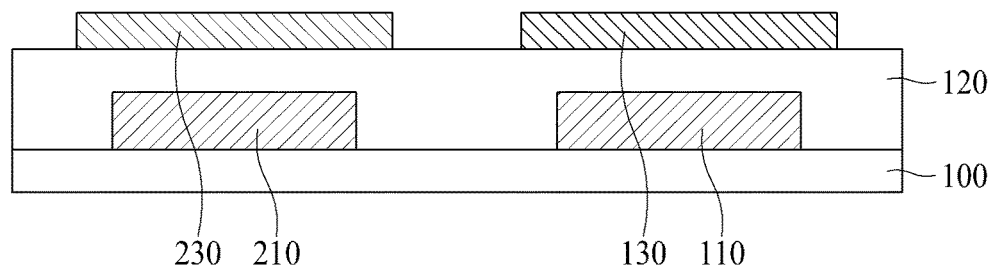

Secondly, as shown in FIG. 9B, first and second active layers 130 and 230 are formed on the gate insulating film 120.

In more detail, a semiconductor layer is formed on the entire surface of the gate insulating film 120 by sputtering or metal organic chemical vapor deposition (MOCVD) method. Then, the semiconductor layer is patterned using a mask process based on a photo-resist pattern, whereby the first and second active layers 130 and 230 are formed. The first active layer 130 may be arranged to overlap the first gate electrode 110, and the second active layer 230 may be arranged to overlap the second gate electrode 210.

The first and second active layers 130 and 230 may be formed of $SnO_2$, Sn-M-$O_x$, Sn-M1-M2-$O_x$, and $SnO_2$ doped with M. In this case, M, M1, or M2 may be an element of d-Block or an element of p-Block in the periodic table of FIG. 7. For example, M, M1 or M2 may be, but not limited to, any one of W, B, Nb, Al, Ga, Pb and Si.

That is, since each of the first and second active layers 130 and 230 is formed of an Sn(IV)$O_2$ based oxide semiconductor layer in step S102 of FIG. 8, each of them has an N type semiconductor characteristic (S102 of FIG. 8).

Figure 9C:
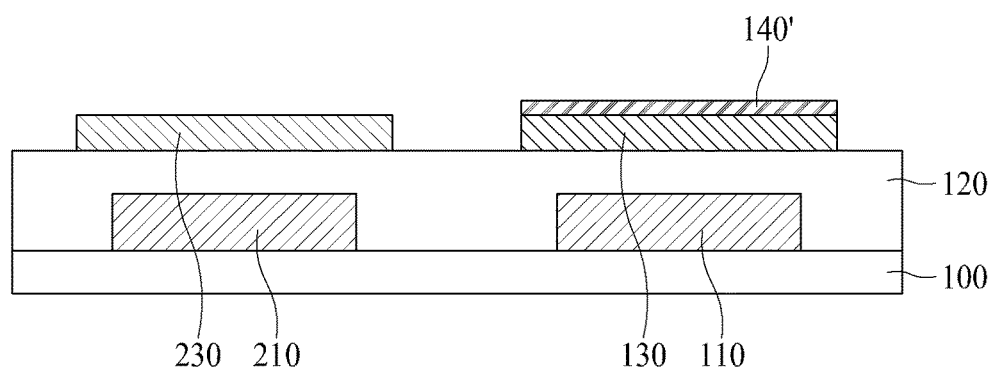

Thirdly, as shown in FIG. 9C, a reactive metal layer 140' is formed on the first active layer 130.

In more detail, a second metal layer may be formed on the gate insulating film 120 and the first and second active layers 130 and 230 by sputtering. Then, after a photo-resist pattern is formed on the second metal layer, the second metal layer is patterned using a mask process for etching the second metal layer, whereby the reactive metal layer 140' may be formed. The reactive metal layer 140' may be formed of Al, Ti, Ta, or an alloy of Mo and Ti, which is likely to generate oxidation (S103 of FIG. 8).

Figure 9D:
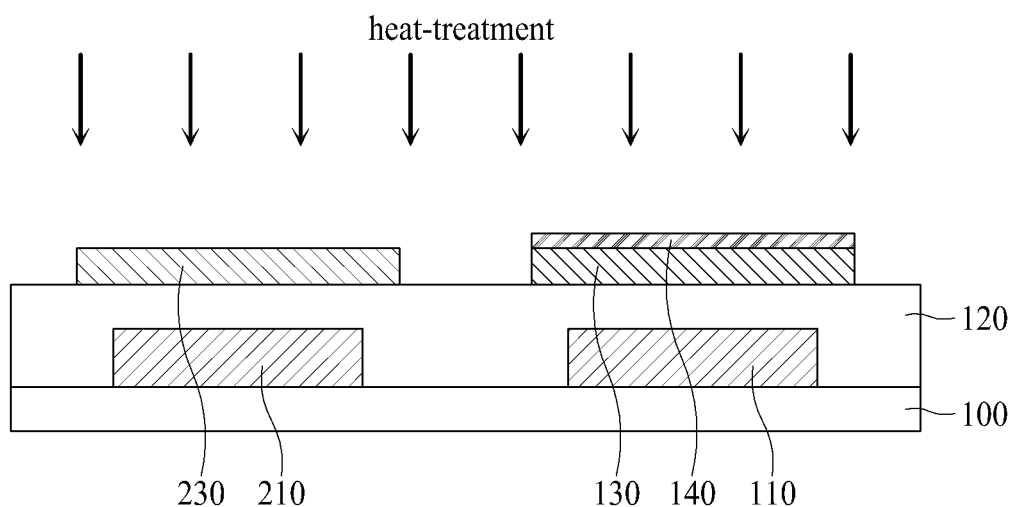

Fourthly, as shown in FIG. 9D, the first active layer 130 and the reactive metal layer 140' are heat-treated, whereby the first active layer 130 is formed as an Sn(II)O based oxide semiconductor layer, and the reactive metal layer 140' is converted to a metal oxide layer 140.

In more detail, the first active layer 130 and the reactive metal layer 140' are heat-treated at a temperature between 200° C. and 500° C. In this case, metal of the reactive metal layer 140' may react with oxygen of the first active layer 130. For this reason, a reduction reaction may be generated in the first active layer 130, and an oxidation reaction may be generated in the reactive metal layer 140'. Therefore, the first active layer 130 may include an Sn(II)O based oxide by means of the reduction reaction, and the reactive metal layer 140' may be converted to the metal oxide layer 140 by means of the oxidation reaction. The metal oxide layer 140 may be an aluminum oxide, a titanium oxide, a thallium oxide, or a molybdenum-titanium oxide. That is, the metal oxide layer 140 may be an insulating film which is electrically insulated.

Figure 10A:
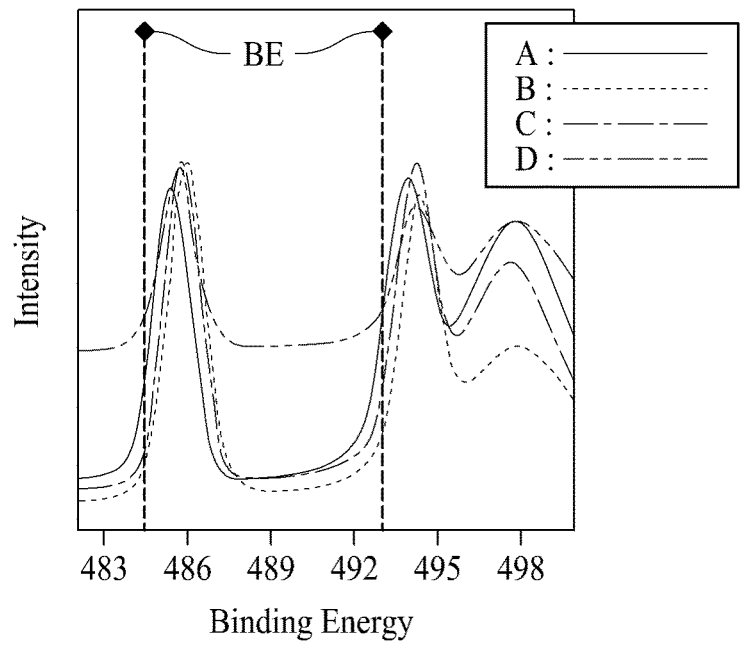
FIGS. 10A to 10D are graphs and tables illustrating results of an XPS analysis for an active layer when a reactive metal layer is not formed and when the reactive metal layer is formed of titanium and heat-treated at 200° C. or 300° C.
Figure 10B:
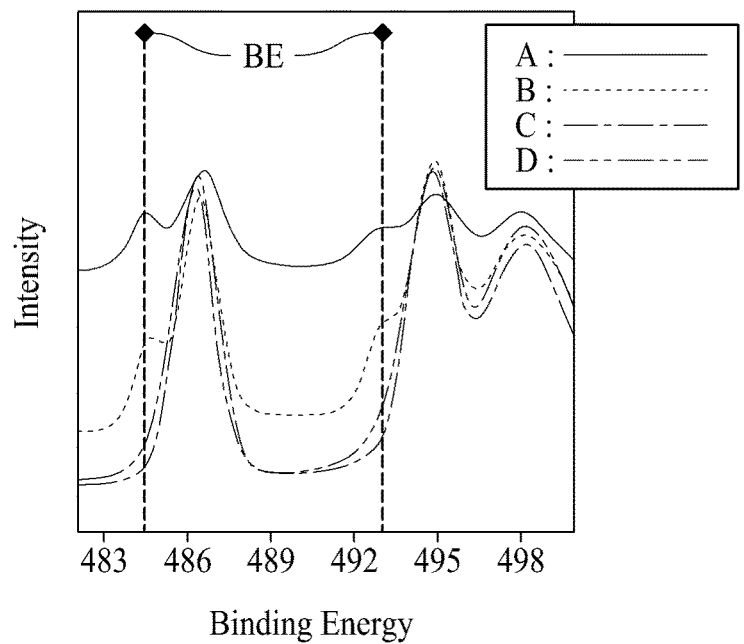
Figures 10C, 10D:
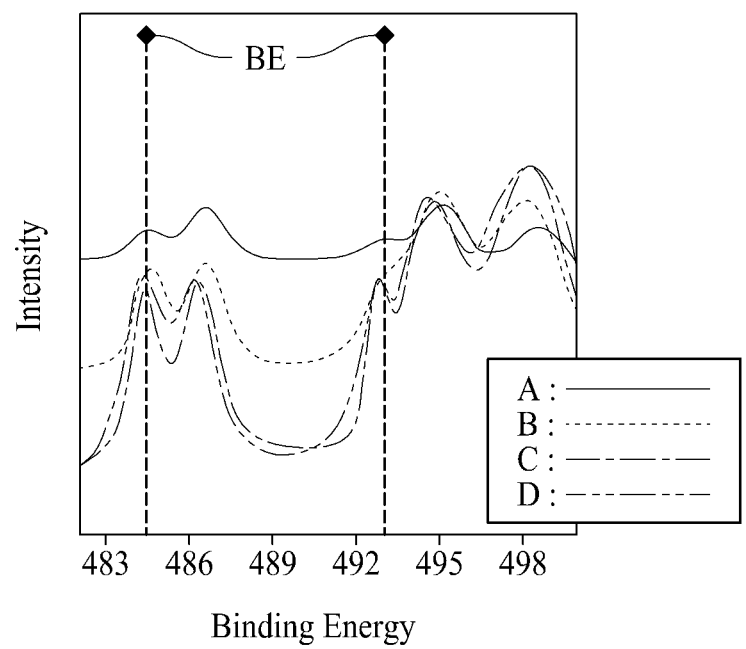

Results of an XPS (x-ray photoelectron spectroscopy) analysis for the active layer when the reactive metal layer is not formed are shown in FIG. 10A, and graphs and tables illustrating results of the XPS analysis for the metal oxide layer and the active layer after the reactive metal layer is formed of titanium and heat-treated at 200° C. or 300° C. are shown in FIGS. 10B and 10C.

In FIG. 10A, a curve A illustrates that the active layer is ion-etched for 30 seconds and then subjected to the XPS analysis, a curve B illustrates that the metal oxide layer and the active layer are ion-etched for 7 minutes and then subjected to the XPS analysis, a curve C illustrates that the metal oxide layer and the active layer are ion-etched for 17 minutes and then subjected to the XPS analysis, and a curve D illustrates that the metal oxide layer and the active layer are ion-etched for 20 minutes and then subjected to the XPS analysis. Ion-etching may be performed using Ar ion.

In FIG. 10B, a curve A illustrates that the active layer is ion-etched for 60 minutes at 200° C. and then subjected to the XPS analysis, a curve B illustrates that the metal oxide layer and the active layer are ion-etched for 66 minutes and then subjected to the XPS analysis, a curve C illustrates that the metal oxide layer and the active layer are ion-etched for 77 minutes and then subjected to the XPS analysis, and a curve D illustrates that the metal oxide layer and the active layer are ion-etched for 81 minutes and then subjected to the XPS analysis.

In FIG. 10C, a curve A illustrates that the active layer is ion-etched for 69 minutes at 300° C. and then subjected to the XPS analysis, a curve B illustrates that the metal oxide layer and the active layer are ion-etched for 74 minutes and then subjected to the XPS analysis, a curve C illustrates that the metal oxide layer and the active layer are ion-etched for 85 minutes and then subjected to the XPS analysis, and a curve D illustrates that the metal oxide layer and the active layer are ion-etched for 91 minutes and then subjected to the XPS analysis.

As shown in FIGS. 10A to 10C, a binding energy (BE) of $Sn^{2+}$ has a value between 484 nm and 485 nm and between 493 nm and 493 nm, approximately.

An XPS analysis is an analysis method for obtaining a binding energy of metal to be analyzed by irradiating X-ray to the metal. If an ion-etching time is short, a binding energy on a metal surface or interface may be obtained, and if the ion-etching time is long, a binding energy inside the metal may be obtained. Therefore, if the reactive metal layer 140' is formed of titanium on the first active layer 130, X-ray may be irradiated for 60 minutes or more as shown in FIGS. 10B and 10C for the XPS analysis of the first active layer 130.

If the reactive metal layer 140' is not formed, as a result of the XPS analysis of the first active layer 130, a peak at a binding energy of $Sn^{2+}$ is not generated as shown in FIG.

10A. Therefore, if the reactive metal layer 140' is not formed, it may be regarded that Sn(II)O does not exist in the first active layer.

If the reactive metal layer 140' is formed of titanium and is heat-treated at 200° C. together with the first active layer 130, a peak at a binding energy of $Sn^{2+}$ of the curve A and the curve B is generated as shown in FIGS. 10B and 10D. Therefore, if the reactive metal layer 140' and the first active layer 130 are heat-treated at 200° C., it may be regarded that Sn(II)O exists on the interface of the first active layer 130. That is, since the first active layer 130 may include an Sn(II)O based oxide, the first active layer 130 may have a P type semiconductor characteristic.

If the reactive metal layer 140' is formed of titanium and is heat-treated at 300° C. together with the first active layer 130, a peak at a binding energy of $Sn^{2+}$ of all the curves A to D is generated as shown in FIGS. 10C and 10D. Therefore, if the reactive metal layer 140' and the first active layer 130 are heat-treated at 300° C., it may be regarded that Sn(II)O exists on the interface of the first active layer 130 and inside the first active layer 130. That is, since the first active layer 130 may include an Sn(II)O based oxide, the first active layer 130 may have a P type semiconductor characteristic.

Graphs and tables illustrating results of the XPS analysis for the active layer when the reactive metal layer is not formed and when the reactive metal layer is formed of titanium and heat-treated at 200° C. or 300° C. are shown in FIGS. 11A to 11D.

Figure 11A:
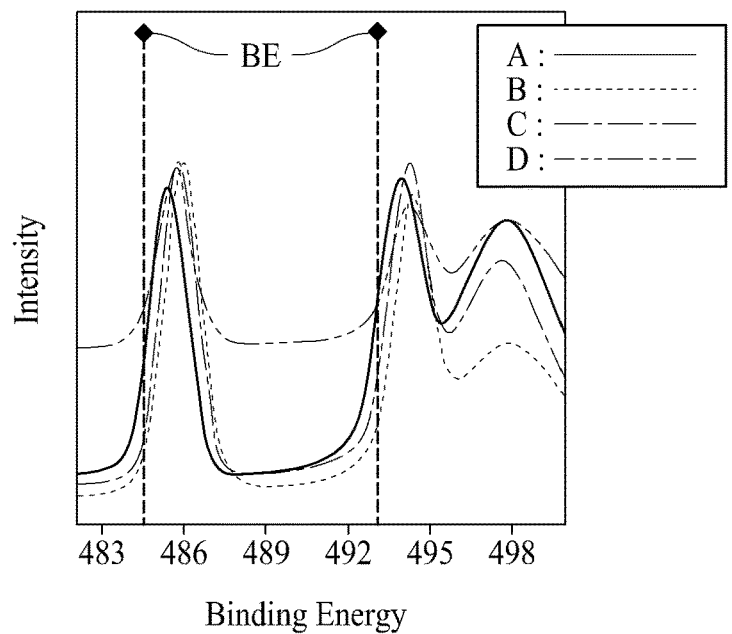
FIGS. 11A to 11D are graphs and tables illustrating results of an XPS analysis for an active layer when a reactive metal layer is not formed and when the reactive metal layer is formed of tantalum and heat-treated at 200° C. or 300° C.

In FIG. 11A, a curve A illustrates that the active layer is ion-etched for 30 seconds and then subjected to the XPS analysis, a curve B illustrates that the metal oxide layer and the active layer are ion-etched for 7 minutes and then subjected to the XPS analysis, a curve C illustrates that the metal oxide layer and the active layer are ion-etched for 17 minutes and then subjected to the XPS analysis, and a curve D illustrates that the metal oxide layer and the active layer are ion-etched for 20 minutes and then subjected to the XPS analysis.

Figure 11B:
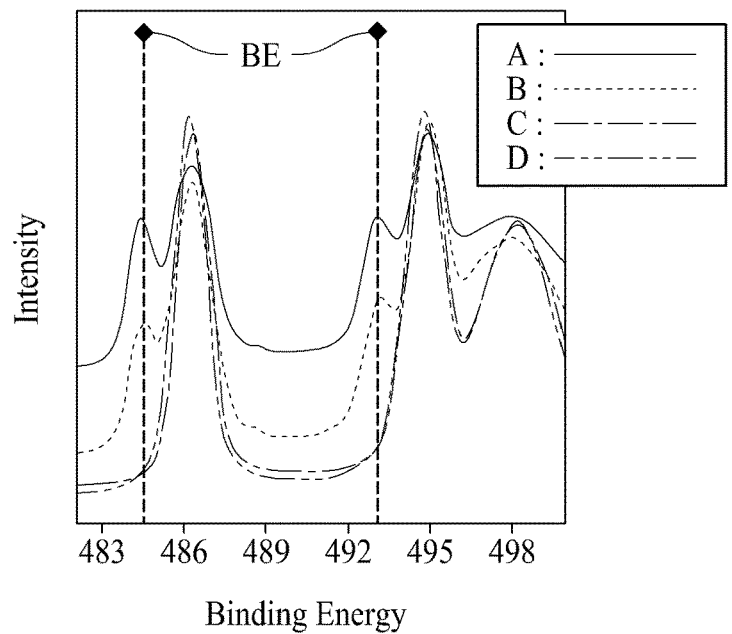

In FIG. 11B, a curve A illustrates that the active layer is ion-etched for 31 minutes at 200° C. and then subjected to the XPS analysis, a curve B illustrates that the metal oxide layer and the active layer are ion-etched for 32 minutes and then subjected to the XPS analysis, a curve C illustrates that the metal oxide layer and the active layer are ion-etched for 37 minutes and then subjected to the XPS analysis, and a curve D illustrates that the metal oxide layer and the active layer are ion-etched for 40 minutes and then subjected to the XPS analysis.

Figures 11C, 11D:
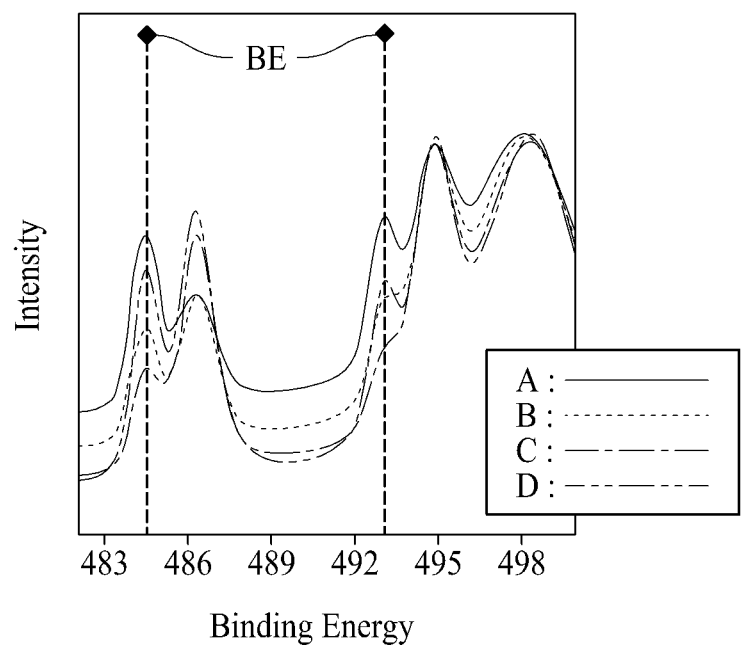

In FIG. 11C, a curve A illustrates that the active layer is ion-etched for 35 minutes at 300° C. and then subjected to the XPS analysis, a curve B illustrates that the metal oxide layer and the active layer are ion-etched for 36 minutes and then subjected to the XPS analysis, a curve C illustrates that the metal oxide layer and the active layer are ion-etched for 38 minutes and then subjected to the XPS analysis, and a curve D illustrates that the metal oxide layer and the active layer are ion-etched for 40 minutes and then subjected to the XPS analysis.

As shown in FIGS. 11A to 11C, a binding energy (BE) of $Sn^{2+}$ has a value between 484 nm and 485 nm and between 493 nm and 493 nm, approximately.

An XPS analysis is an analysis method for obtaining a binding energy of metal to be analyzed by irradiating X-ray to the metal. If an ion-etching time is short, a binding energy on a metal surface or interface may be obtained, and if the ion-etching time is long, a binding energy inside the metal may be obtained. Therefore, if the reactive metal layer 140' is formed of titanium on the first active layer 130, X-ray may be irradiated for 30 minutes or more as shown in FIGS. 11B and 11C for the XPS analysis of the first active layer 130.

If the reactive metal layer 140' is not formed, as a result of the XPS analysis of the first active layer 130, a peak at a binding energy of $Sn^{2+}$ is not generated as shown in FIG. 11A. Therefore, if the reactive metal layer 140' is not formed, it may be regarded that Sn(II)O does not exist in the first active layer.

If the reactive metal layer 140' is formed of titanium and is heat-treated at 200° C. together with the first active layer 130, a peak at a binding energy of $Sn^{2+}$ of the curve A and the curve B is generated as shown in FIGS. 11B and 11D. Therefore, if the reactive metal layer 140' and the first active layer 130 are heat-treated at 200° C., it may be regarded that Sn(II)O exists on the interface of the first active layer 130. That is, since the first active layer 130 may include an Sn(II)O based oxide, the first active layer 130 may have a P type semiconductor characteristic.

If the reactive metal layer 140' is formed of titanium and is heat-treated at 300° C. together with the first active layer 130, a peak at a binding energy of $Sn^{2+}$ of all the curves A to D is generated as shown in FIGS. 11C and 11D. Therefore, if the reactive metal layer 140' and the first active layer 130 are heat-treated at 300° C., it may be regarded that Sn(II)O exists on the interface of the first active layer 130 and inside the first active layer 130. That is, since the first active layer 130 may include an Sn(II)O based oxide, the first active layer 130 may have a P type semiconductor characteristic.

As shown in FIG. 2, since Gibbs free energy of $Sn(IV)O_2$ is lower than that of Sn(II)O, Sn(II)O is easily transited to $Sn(IV)O_2$ having low Gibbs free energy. For this reason, it is general that Sn based oxide exists as $Sn(IV)O_2$. However, in the aspect of the present disclosure, the reactive metal layer 140' is formed on the first active layer 130 and then heat-treated at a temperature between 200° C. and 500° C., whereby oxidation reaction may be generated in the reactive metal layer 140' and reduction reaction may be generated in the first active layer 130. As a result, in the aspect of the present disclosure, the first active layer 130 may be formed of an Sn(II)O based oxide semiconductor layer. Therefore, in the aspect of the present disclosure, an Sn(II)O based oxide semiconductor transistor having a P type semiconductor characteristic may be formed (S104 of FIG. 8).

Figure 9E:
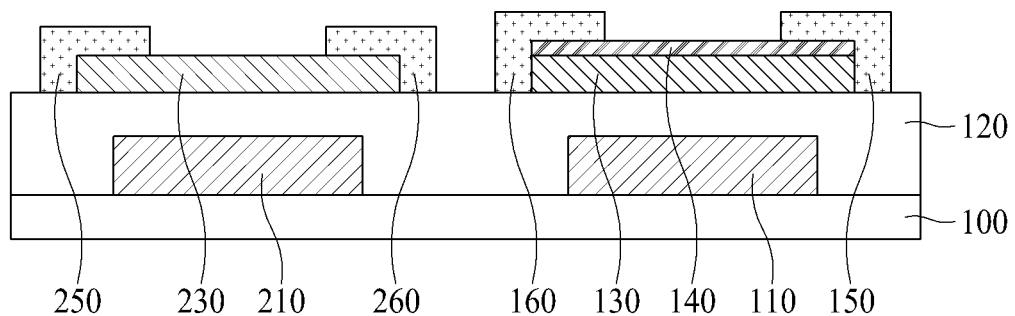
Figure 9F:
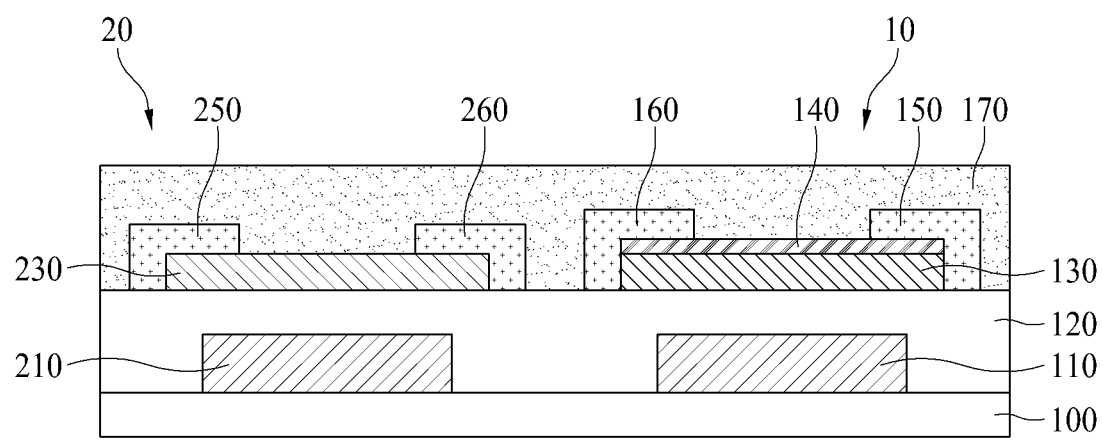

Fifthly, as shown in FIG. 9E, first and second source electrodes 150 and 250 and first and second drain electrodes 160 and 260 are formed on the first and second active layers 130 and 230.

In more detail, a third metal layer is formed on the gate insulating film 120, the first and second active layers 130 and 230 and the metal oxide layer 140 by sputtering or metal organic chemical vapor deposition (MOCVD) method. Then, the third metal layer is patterned using a mask process based on a photo-resist pattern, whereby the first and second source electrodes 150 and 250 and the first and second drain electrodes 160 and 260 are formed.

The first source electrode 150 may be in contact with the first active layer 130 at a first side of the first active layer 130. The first drain electrode 160 may be in contact with the first active layer 130 at a second side of the first active layer 130. For example, as shown in FIG. 9e, the first source electrode 150 may be in contact with, but not limited to, an upper surface of the metal oxide layer 140 and the first side of the first active layer 130, and the first drain electrode 160 may be in contact with, but not limited to, the upper surface of the metal oxide layer 140 and the second side of the first active layer 130.

The second source electrode 250 may be in contact with the second active layer 230 at a first side of the second active layer 230. The second drain electrode 260 may be in contact with the second active layer 230 at a second side of the second active layer 230. For example, as shown in FIG. 9E, the second source electrode 250 may be in contact with, but not limited to, an upper surface and the first side of the second active layer 230, and the second drain electrode 260 may be in contact with, but not limited to, the upper surface and the second side of the second active layer 230.

The first drain electrode 160 and the second drain electrode 260 may be connected with each other. In this case, the first and second thin film transistors 10 and 20 may serve as CMOS circuits as shown in FIG. 5.

The first and second source electrodes 150 and 250 and the first and second drain electrodes 160 and 260 may be formed of a single layer or multi-layer comprised of any one of Mo, Al, Cr, Au, Ti, Ni, Nd and Cu or their alloy. However, since the first source electrode 150 and the first drain electrode 160 are in contact with the first active layer 130 having P type semiconductor characteristic, the first and second source electrodes 150 and 250 and the first and second drain electrodes 160 and 260 may be formed of a single layer or multi-layer comprised of any one of Pd (5.22 eV or 5.6 eV), Pt (5.12 eV to 5.93 eV), Au (5.1 eV to 5.47 eV), and Ni (5.04 eV to 5.35 eV), which are greater than a work function of 5.0 eV, or their alloy.

Then, an inter-layer dielectric film 170 is formed on the first and second source electrodes 150 and 250 and the first and second drain electrodes 160 and 260. The inter-layer dielectric film 170 may be formed of an inorganic film, for example, a silicon oxide film ($SiO_x$), a silicon nitride film ($SiN_x$), or a multi-layered film of the silicon oxide film and the silicon nitride film (S105 of FIG. 8).

As described above, according to the aspect of the present disclosure, the reactive metal layer 140' is formed on the first active layer 130 and then heat-treated at a temperature between 200° C. and 500° C., whereby the oxidation reaction may be generated in the reactive metal layer 140' and the reduction reaction may be generated in the first active layer 130. As a result, in the aspect of the present disclosure, the first active layer 130 may be formed of an Sn(II)O based oxide semiconductor layer. Therefore, in the aspect of the present disclosure, an Sn(II)O based oxide semiconductor transistor having a P type semiconductor characteristic may be formed.

Figure 12:
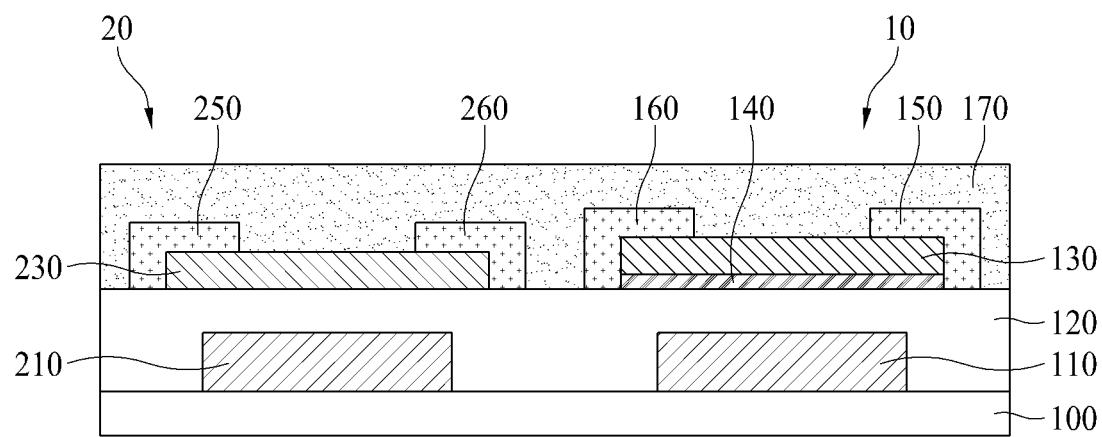
FIG. 12 is a cross-sectional view illustrating first and second thin film transistors according to a second aspect of the present disclosure.

FIG. 12 is a cross-sectional view illustrating first and second thin film transistors according to the second aspect of the present disclosure.

In FIG. 12, first and second thin film transistors 10 and 20 are formed in an inverted staggered structure based on a back channel etched (BCE) process. The inverted staggered structure has a bottom gate structure in which a gate electrode is formed below an active layer.

Referring to FIG. 12, the first thin film transistor 10 according to a second aspect of the present disclosure includes a first gate electrode 110, a first active layer 130, a metal oxide layer 140, a first source electrode 150, and a first drain electrode 160. The second thin film transistor 20 according to the second aspect of the present disclosure includes a second gate electrode 210, a second active layer 230, a second source electrode 250, and a second drain electrode 260.

The second aspect of FIG. 12 is substantially the same as the first aspect described with reference to FIG. 6 except that the metal oxide layer 140 is formed below the first active layer 130. Therefore, a detailed description of FIG. 12 will be omitted.

Also, a method for manufacturing the first and second thin film transistors 10 and 20 according to the second aspect of the present disclosure is substantially the same as the method described with reference to FIGS. 8 and 9A to 9F except that the order of the steps S102 and S103 of FIG. 8 is changed. Therefore, a detailed description of the method for manufacturing the first and second thin film transistors 10 and 20 according to the second aspect of the present disclosure will be omitted.

Figure 13:
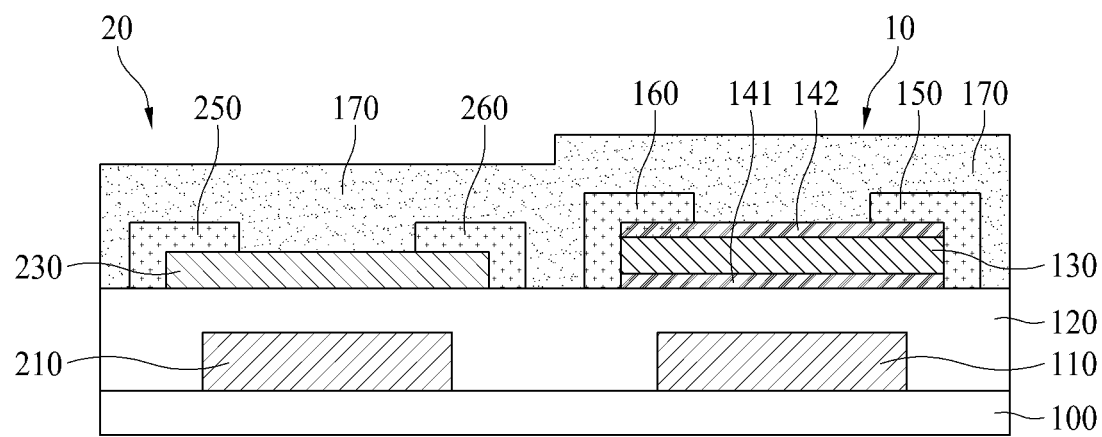
FIG. 13 is a cross-sectional view illustrating first and second thin film transistors according to a third aspect of the present disclosure.

FIG. 13 is a cross-sectional view illustrating first and second thin film transistors according to the third aspect of the present disclosure.

In FIG. 13, first and second thin film transistors 10 and 20 are formed in an inverted staggered structure based on a back channel etched (BCE) process. The inverted staggered structure has a bottom gate structure in which a gate electrode is formed below an active layer.

Referring to FIG. 13, the first thin film transistor 10 according to a third aspect of the present disclosure includes a first gate electrode 110, a first active layer 130, a metal oxide layer 140, a first source electrode 150, and a first drain electrode 160. The second thin film transistor 20 according to the third aspect of the present disclosure includes a second gate electrode 210, a second active layer 230, a second source electrode 250, and a second drain electrode 260.

The third aspect of FIG. 13 is substantially the same as the first aspect described with reference to FIG. 6 except that a first metal oxide layer 141 is formed below the first active layer 130 and a second metal oxide layer 142 is formed on the first active layer 130. As shown in FIG. 13, if the first and second metal oxide layers 141 and 142 are formed below and on the first active layer 130, a reduction reaction is generated below and on the first active layer 130, whereby a time period for forming the first active layer 130 as Sn(II)O based oxide semiconductor layer may be reduced.

Also, a method for manufacturing the first and second thin film transistors 10 and 20 according to the third aspect of the present disclosure is substantially the same as the method described with reference to FIGS. 8 and 9A to 9F except that the first metal oxide layer 141 is additionally formed prior to the step S102 of FIG. 8. Therefore, a detailed description of the method for manufacturing the first and second thin film transistors 10 and 20 according to the third aspect of the present disclosure will be omitted.

Figure 14:
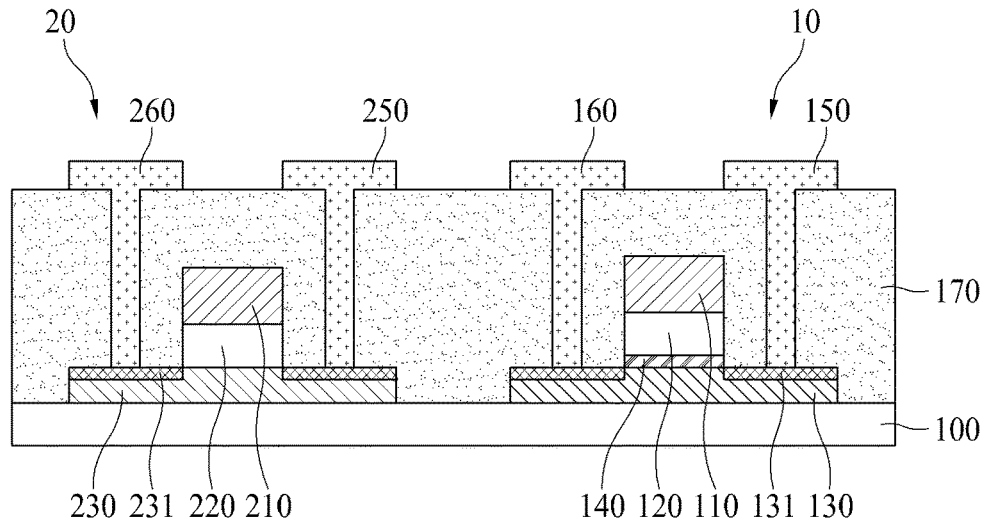
FIG. 14 is a cross-sectional view illustrating first and second thin film transistors according to a fourth aspect of the present disclosure.

FIG. 14 is a cross-sectional view illustrating first and second thin film transistors according to a fourth aspect of the present disclosure.

In FIG. 14, first and second thin film transistors 10 and 20 are formed in a coplanar structure. The coplanar structure has a top gate structure in which a gate electrode is formed on an active layer.

Referring to FIG. 14, the first thin film transistor 10 according to the fourth aspect of the present disclosure includes a first gate electrode 110, a first active layer 130, a metal oxide layer 140, a first source electrode 150, and a first drain electrode 160. The second thin film transistor 20 according to the fourth aspect of the present disclosure includes a second gate electrode 210, a second active layer 230, a second source electrode 250, and a second drain electrode 260.

The first and second thin film transistors 10 and 20 may be formed on a buffer film 100 formed on a substrate. The substrate may be formed of plastic or glass. The buffer film 100 is intended to protect the first and second thin film transistors 10 and 20 from water permeated through the substrate. The buffer film 100 may be made of a plurality of inorganic films which are deposited alternately. For example, the buffer film 100 may be formed of a multi-layered film of one or more inorganic films of a silicon oxide film ($SiO_x$), a silicon nitride film ($SiN_x$) and SiON, which are deposited alternately. The buffer film 100 may be omitted, and in this case, the first and second thin film transistors 10 and 20 may be formed on the substrate.

The first and second active layers 130 and 230 are formed on the buffer film 100. The first active layer 130 may be an Sn(II)O based oxide semiconductor layer. That is, the first active layer 130 may be a semiconductor layer that includes Sn(II)O based oxide. For example, the first active layer 130 may include SnO, Sn-M-$O_x$, Sn-M1-M2-$O_x$, and SnO doped with M. In this case, M, M1, or M2 may be an element of d-Block or an element of p-Block in the periodic table of FIG. 7.

For example, M, M1 or M2 may be, but not limited to, any one of W, B, Nb, Al, Ga, Pb and Si.

The second active layer 230 may be an Sn(IV)$O_2$ based oxide semiconductor layer. That is, the second active layer 230 may be a semiconductor layer that includes an Sn(IV)$O_2$ based oxide. For example, the second active layer 230 may include $SnO_2$, Sn-M-$O_x$, Sn-M1-M2-$O_x$, and $SnO_2$ doped with M. In this case, M, M1, or M2 may be an element of d-Block or an element of p-Block in the periodic table of FIG. 7. For example, M, M1 or M2 may be, but not limited to, any one of W, B, Nb, Al, Ga, Pb and Si.

Since the first active layer 130 is formed of an Sn(II)O based oxide semiconductor layer, the first active layer 130 has a P type semiconductor characteristic. By contrast, since the second active layer 230 is formed of an Sn(IV)$O_2$ based oxide semiconductor layer, the second active layer 230 has an N type semiconductor characteristic.

The metal oxide layer 140 is formed on the first active layer 130. The metal oxide layer 140 is formed on a part of an upper surface of the first active layer 130, and the upper surface of the first active layer 130, which is not covered with the metal oxide layer 140, may be defined as a conductive area having conductivity. The metal oxide layer 140 is an insulating film which is electrically insulated, and may include metal which is likely to generate oxidation. For example, the metal oxide layer 140 may be an aluminum oxide, a titanium oxide, a thallium oxide, or a molybdenum-titanium oxide.

A detailed description of a method for forming the first active layer 130, the second active layer 230 and the metal oxide layer 140 will be described later with reference to FIGS. 15 and 16A to 16D.

A gate insulating film 120 is formed on the metal oxide layer 140. The gate insulating film 120 may be formed of an inorganic film, for example, a silicon oxide film ($SiO_x$), a silicon nitride film ($SiN_x$) or a multi-layered film of the silicon oxide film and the silicon nitride film.

The first and second gate electrodes 110 and 210 are formed on the gate insulating film 120. The first gate electrode 110 may be arranged to overlap the first active layer 130, and the second gate electrode 210 may be arranged to overlap the second active layer 230. The first and second gate electrodes 110 and 210 may be formed of a single layer or multi-layer comprised of any one of Mo, Al, Cr, Au, Ti, Ni, Nd and Cu or their alloy.

An inter-layer dielectric film 170 is formed on the first and second active layers 130 and 230 and the first and second gate electrodes 110 and 210. The inter-layer dielectric film 170 may be formed of an inorganic film, for example, a silicon oxide film ($SiO_x$), a silicon nitride film ($SiN_x$), or a multi-layered film of the silicon oxide film and the silicon nitride film.

The first and second source electrodes 150 and 250 and the first and second drain electrodes 160 and 260 are formed on the inter-layer dielectric film 170. First and second contact holes CT1 and CT2 for partially exposing the first active layer 130 by passing through the inter-layer dielectric film 170 and third and fourth contact holes CT3 and CT4 for partially exposing the second active layer 230 are formed in the inter-layer dielectric film 170.

The first source electrode 150 may be in contact with the first active layer 130 at a first side of the first active layer 130 through the first contact hole CT1. The first drain electrode 160 may be in contact with the first active layer 130 at a second side of the first active layer 130 through the second contact hole CT2. Also, each of the first source electrode 150 and the first drain electrode 160 may be in contact with a conducting area 131 of the first active layer 130.

The second source electrode 250 may be in contact with the second active layer 230 at a first side of the second active layer 230 through the third contact hole CT3. The second drain electrode 260 may be in contact with the second active layer 230 at a second side of the second active layer 230 through the fourth contact hole CT4. Also, each of the second source electrode 250 and the second drain electrode 260 may be in contact with a conducting area 231 of the second active layer 230.

Figure 20:
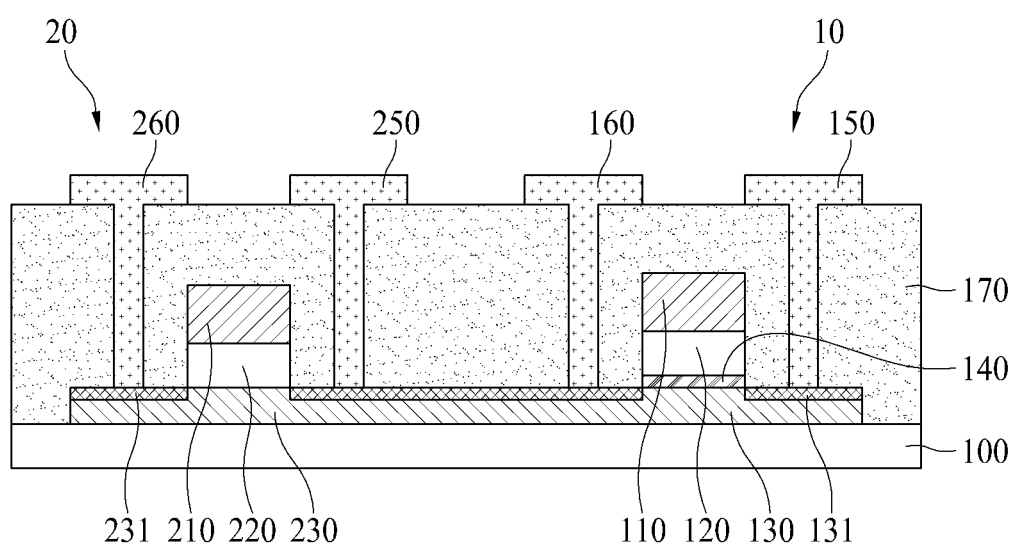
FIG. 20 is a cross-sectional view illustrating first and second thin film transistors according to an eighth aspect of the present disclosure.

The first drain electrode 160 and the second drain electrode 260 may be connected with each other on the inter-layer dielectric film 170, or the first active layer 130 and the second active layer 230 may be connected with each other as shown in FIG. 20. In this case, the first and second thin film transistors 10 and 20 may serve as CMOS circuits as shown in FIG. 5.

As described above, according to the aspect of the present disclosure, the first thin film transistor 10 that includes a first active layer 130 having an Sn(II)O based oxide and the second thin film transistor 20 that includes a second active layer 230 having an Sn(IV)$O_2$ based oxide are provided. As a result, according to the aspect of the present disclosure, the first thin film transistor 10 may be realized as a thin film transistor having a P type semiconductor characteristic, and the second thin film transistor 20 may be realized as a thin film transistor having an N type semiconductor characteristic.

Figure 15:
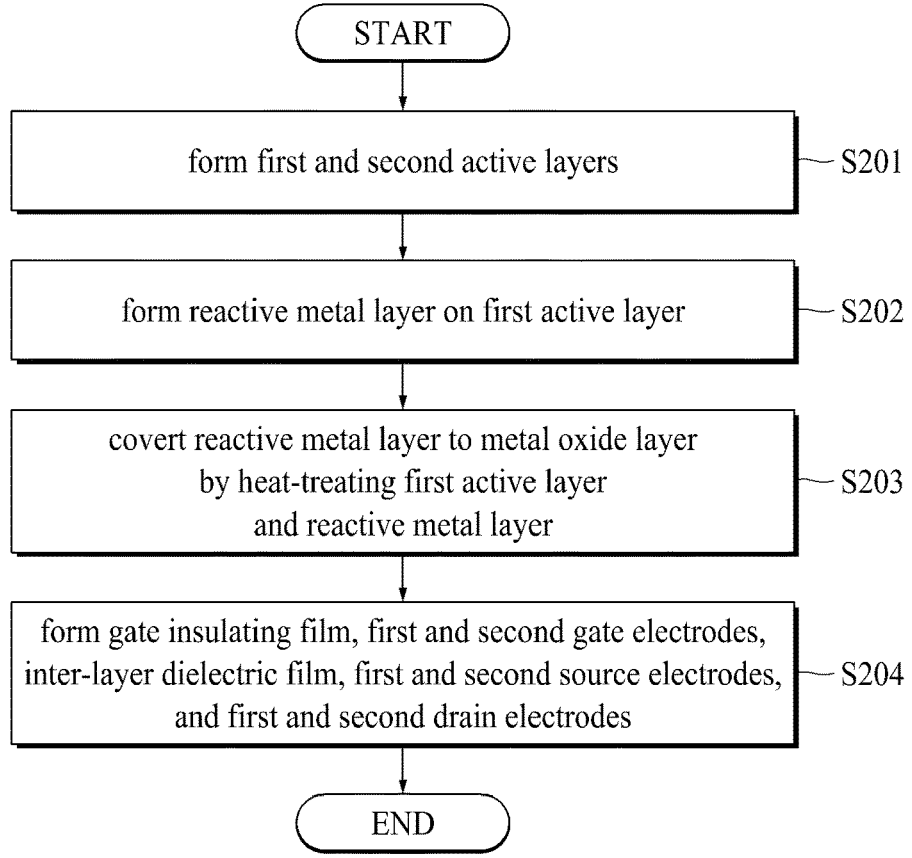
FIG. 15 is a flow chart illustrating a method for manufacturing first and second thin film transistors according to the fourth aspect of the present disclosure.

FIG. 15 is a flow chart illustrating a method for manufacturing first and second thin film transistors according to the fourth aspect of the present disclosure. FIGS. 16A to 16D are cross-sectional views illustrating a method for manufacturing first and second thin film transistors according to the fourth aspect of the present disclosure;

Since the cross-sectional views shown in FIGS. 16A to 16D are intended to describe a method for manufacturing the first and second thin film transistors 10 and 20 shown in FIG. 14, the same reference numerals are used to the same elements. Hereinafter, the method for manufacturing the first and second thin film transistors according to the fourth aspect of the present disclosure will be described in detail with reference to FIGS. 15 and 16A to 16D.

Figure 16A:
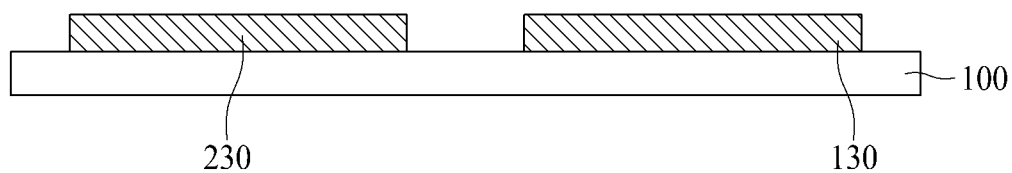
FIGS. 16A to 16D are cross-sectional views illustrating a method for manufacturing first and second thin film transistors according to the fourth aspect of the present disclosure.

First of all, as shown in FIG. 16A, first and second active layers 130 and 230 are formed on a buffer film 100.

The buffer film 100 is intended to protect the first and second thin film transistors 10 and 20 from moisture permeated through a substrate. The buffer film 100 may be made of a plurality of inorganic films which are deposited alternately. For example, the buffer film 100 may be formed of a multi-layered film of one or more inorganic films of a silicon oxide film ($SiO_x$), a silicon nitride film ($SiN_x$) and SiON, which are alternately deposited. The buffer film 100 may be formed using a plasma enhanced chemical vapor deposition (PECVD) method. The buffer film 100 may be omitted.

Then, the first and second active layers 130 and 230 are formed on the buffer film 100. In more detail, a semiconductor layer is formed on the entire surface of the gate insulating film 120 by sputtering or MOCVD method. Then, the semiconductor layer is patterned using a mask process based on a photo-resist pattern, whereby the first and second active layers 130 and 230 are formed.

The first and second active layers 130 and 230 may be formed of $SnO_2$, $Sn-M-O_x$, $Sn-M1-M2-O_x$, and $SnO_2$ doped with M. In this case, M, M1, or M2 may be an element of d-Block or an element of p-Block in the periodic table of FIG. 7. For example, M, M1 or M2 may be, but not limited to, any one of W, B, Nb, Al, Ga, Pb and Si.

That is, since each of the first and second active layers 130 and 230 is formed of an Sn(IV)$O_2$ based oxide semiconductor layer in step S201 of FIG. 15, each of them has an N type semiconductor characteristic (S201 of FIG. 15).

Figure 16B:
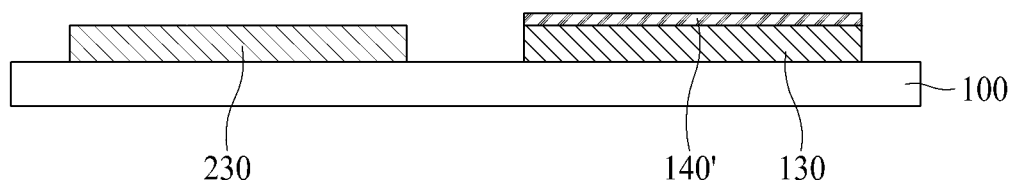

Secondly, as shown in FIG. 16B, a reactive metal layer 140' is formed on the first active layer 130.

In more detail, a first metal layer may be formed on the gate insulating film 120 and the first and second active layers 130 and 230 by sputtering. Then, after a photo-resist pattern is formed on the first metal layer, the first metal layer is patterned using a mask process for etching the first metal layer, whereby the reactive metal layer 140' may be formed. The reactive metal layer 140' may be formed of Al, Ti, Ta, or an alloy of Mo and Ti, which is likely to generate oxidation (S202 of FIG. 15).

Figure 16C:
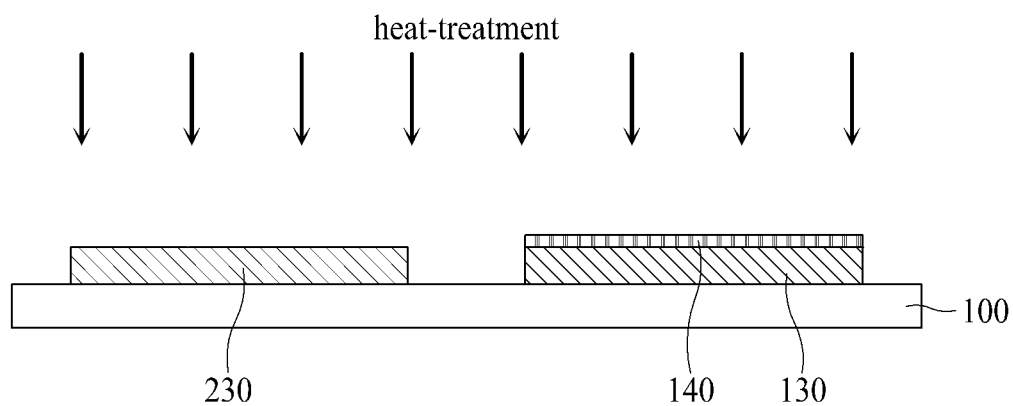

Thirdly, as shown in FIG. 16C, the first active layer 130 and the reactive metal layer 140' are heat-treated, whereby the first active layer 130 is formed as an Sn(II)O based oxide semiconductor layer, and the reactive metal layer 140' is converted to a metal oxide layer 140.

In more detail, the first active layer 130 and the reactive metal layer 140' are heat-treated at a temperature between 200° C. and 500° C. In this case, metal of the reactive metal layer 140' may react with oxygen of the first active layer 130. For this reason, a reduction reaction may be generated in the first active layer 130, and an oxidation reaction may be generated in the reactive metal layer 140'. Therefore, the first active layer 130 may include an Sn(II)O based oxide by means of the reduction reaction, and the reactive metal layer 140' may be converted to the metal oxide layer 140 by means of the oxidation reaction. The metal oxide layer 140 may be an aluminum oxide, a titanium oxide, a thallium oxide, or a molybdenum-titanium oxide. (S103 of FIG. 15)

Figure 16D:
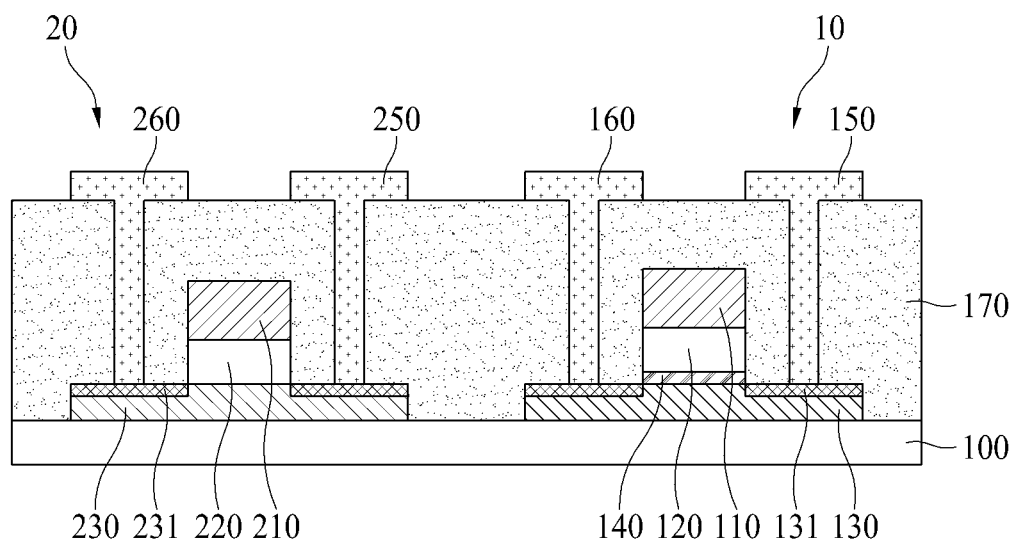

Fourthly, the gate insulating film 120, the first and second gate electrodes 110 and 210, the inter-layer dielectric film 170, the first and second source electrodes 150 and 250, and the first and second drain electrodes 160 and 260 are formed as shown in FIG. 16D.

The gate insulating film 120 and the first and second gate electrodes 110 and 210 are formed on the second active layer 230 and the metal oxide layer 140. In more detail, the gate insulating film 120 and the second metal layer may be formed on the first and second active layers and the metal oxide layer 140. Then, after a photo-resist pattern is formed on the second metal layer, the second metal layer and the gate insulating film 120 are patterned using a mask process for etching the second metal layer and the second gate insulating film 120, whereby the gate insulating film 120 and the first and second gate electrodes 110 and 210 may be formed.

Also, the metal oxide layer which is not covered with the first gate electrode 110 and the gate insulating film 120 may be etched by an etching process. Also, upper surfaces of the first and second active layers 130 and 230, which are not covered with the first gate electrode 110 and the gate insulating film 120 become conductive areas of the first and second active layers.

The gate insulating film 120 may be formed of an inorganic film, for example, a silicon oxide film ($SiO_x$), a silicon nitride film ($SiN_x$) or a multi-layered film of the silicon oxide film and the silicon nitride film. The first and second gate electrodes 110 and 210 may be formed of a single layer or multi-layer comprised of any one of Mo, Al, Cr, Au, Ti, Ni, Nd and Cu or their alloy.

Then, the inter-layer dielectric film 170 is formed on the first and second active layers 130 and 230 and the first and second gate electrodes 110 and 210. The inter-layer dielectric film 170 may be formed of an inorganic film, for example, a silicon oxide film ($SiO_x$), a silicon nitride film ($SiN_x$), or a multi-layered film of the silicon oxide film and the silicon nitride film. The inter-layer dielectric film 170 may be formed using a plasma enhanced chemical vapor deposition (PECVD) method.

Then, first and second contact holes CT1 and CT2 for partially exposing the first active layer 130 and third and fourth contact holes CT3 and CT4 for partially exposing the second active layer 230 are formed to pass through the inter-layer dielectric film 170.

First and second source electrodes 150 and 250 and first and second drain electrodes 160 and 260 may be formed on the inter-layer dielectric film 170.

In more detail, a third metal layer is formed on the inter-layer dielectric film 170 by sputtering or metal organic chemical vapor deposition (MOCVD) method. Then, the third metal layer is patterned using a mask process based on a photo resist pattern, whereby the first and second source electrodes 150 and 250 and the first and second drain electrodes 160 and 260 are formed.

The first source electrode 150 may be in contact with the first active layer 130 at a first side of the first active layer 130 through the first contact hole CT1. The first drain electrode 160 may be in contact with the first active layer 130 at a second side of the first active layer 130 through the second contact hole CT2. Also, each of the first source electrode 150 and the first drain electrode 160 may be in contact with a conducting area 131 of the first active layer 130.

The second source electrode 250 may be in contact with the second active layer 230 at a first side of the second active layer 230 through the third contact hole CT3. The second drain electrode 260 may be in contact with the second active layer 230 at a second side of the second active layer 230 through the fourth contact hole CT4. Also, each of the second source electrode 250 and the second drain electrode 260 may be in contact with a conducting area 231 of the second active layer 230.

The first drain electrode 160 and the second drain electrode 260 may be connected with each other on the inter-layer dielectric film 170. In this case, the first and second thin film transistors 10 and 20 may serve as CMOS circuits as shown in FIG. 5.

The first and second source electrodes 150 and 250 and the first and second drain electrodes 160 and 260 may be formed of a single layer or multi-layer comprised of any one of Mo, Al, Cr, Au, Ti, Ni, Nd and Cu or their alloy. However, since the first source electrode 150 and the first drain electrode 160 are in contact with the first active layer 130 having P type semiconductor characteristic, the first and second source electrodes 150 and 250 and the first and second drain electrodes 160 and 260 may be formed of a single layer or multi-layer comprised of any one of Pd (5.22 eV or 5.6 eV), Pt (5.12 eV to 5.93 eV), Au (5.1 eV to 5.47 eV), and Ni (5.04 eV to 5.35 eV), which are greater than a work function of 5.0 eV, or their alloy. (S204 of FIG. 15)

As described above, according to the aspect of the present disclosure, the reactive metal layer 140' is formed on the first active layer 130 and then heat-treated at a temperature between 200° C. and 500° C., whereby the oxidation reaction may be generated in the reactive metal layer 140' and the reduction reaction may be generated in the first active layer 130. As a result, in the aspect of the present disclosure, the first active layer 130 may be formed of an Sn(II)O based oxide semiconductor layer. Therefore, in the aspect of the present disclosure, an Sn(II)O based oxide semiconductor transistor having a P type semiconductor characteristic may be formed.

Figure 17:
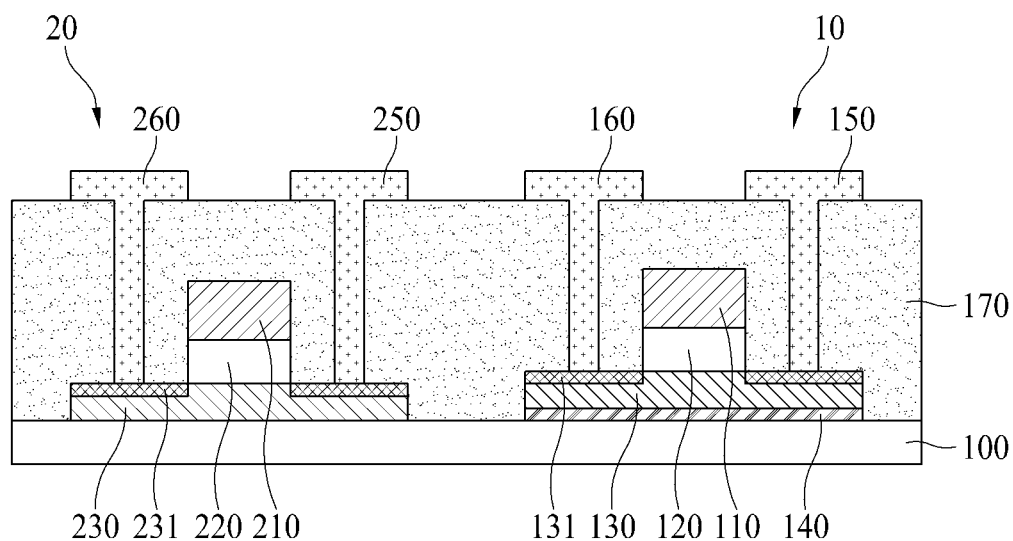
FIG. 17 is a cross-sectional view illustrating first and second thin film transistors according to a fifth aspect of the present disclosure.

FIG. 17 is a cross-sectional view illustrating first and second thin film transistors according to a fifth aspect of the present disclosure.

In FIG. 17, first and second thin film transistors 10 and 20 are formed in a coplanar structure. The coplanar structure has a top gate structure in which a gate electrode is formed on an active layer.

Referring to FIG. 17, the first thin film transistor 10 according to the fifth aspect of the present disclosure includes a first gate electrode 110, a first active layer 130, a metal oxide layer 140, a first source electrode 150, and a first drain electrode 160. The second thin film transistor 20 according to the fifth aspect of the present disclosure includes a second gate electrode 210, a second active layer 230, a second source electrode 250, and a second drain electrode 260.

The fifth aspect of FIG. 17 is substantially the same as the fourth aspect described with reference to FIG. 14 except that the metal oxide layer 140 is formed below the first active layer 130. Therefore, a repetitive description of FIG. 17 will be omitted.

Also, a method for manufacturing the first and second thin film transistors 10 and 20 according to the fifth aspect of the present disclosure is substantially the same as the method described with reference to FIGS. 15 and 16A to 16D except that the order of the steps S201 and S202 of FIG. 14 is changed. Therefore, a repetitive description of the method for manufacturing the first and second thin film transistors 10 and 20 according to the fifth aspect of the present disclosure will be omitted.

Figure 18:
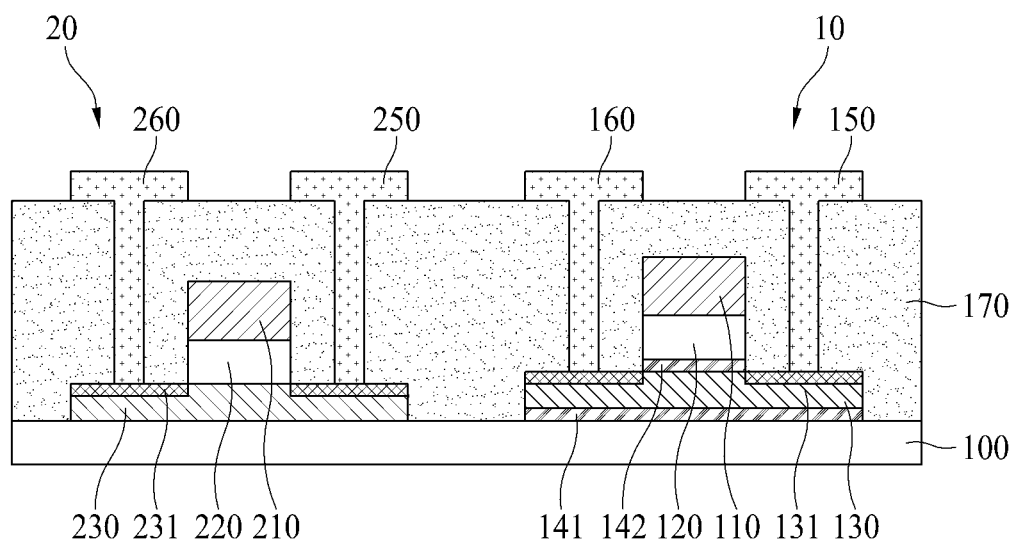
FIG. 18 is a cross-sectional view illustrating first and second thin film transistors according to a sixth aspect of the present disclosure.

FIG. 18 is a cross-sectional view illustrating first and second thin film transistors according to a sixth aspect of the present disclosure.

In FIG. 18, first and second thin film transistors 10 and 20 are formed in a coplanar structure. The coplanar structure has a top gate structure in which a gate electrode is formed on an active layer.

Referring to FIG. 18, the first thin film transistor 10 according to the sixth aspect of the present disclosure includes a first gate electrode 110, a first active layer 130, a first metal oxide layer 141, a second metal oxide layer 142, a first source electrode 150, and a first drain electrode 160. The second thin film transistor 20 according to the sixth aspect of the present disclosure includes a second gate electrode 210, a second active layer 230, a second source electrode 250, and a second drain electrode 260.

The sixth aspect of FIG. 18 is substantially the same as the fourth aspect described with reference to FIG. 14 except that the first metal oxide layer 141 is formed below the first active layer 130 and the second metal oxide layer 142 is formed on the first active layer 130. Therefore, a repetitive description of FIG. 18 will be omitted.

Also, a method for manufacturing the first and second thin film transistors 10 and 20 according to the sixth aspect of the present disclosure is substantially the same as the method described with reference to FIGS. 15 and 16A to 16D except that the step of forming the first metal layer 141 is added prior to the step of S201 of FIG. 14. Therefore, a repetitive description of the method for manufacturing the first and second thin film transistors 10 and 20 according to the sixth aspect of the present disclosure will be omitted.

As described above, according to the aspect of the present disclosure, the following advantages may be obtained.

In the aspect of the present disclosure, the reactive metal layer is formed on the first active layer and then heat-treated at a temperature between 200° C. and 500° C., whereby the oxidation reaction may be generated in the reactive metal layer and the reduction reaction may be generated in the first active layer. For this reason, in the aspect of the present disclosure, the first active layer may be formed of Sn(II)O based oxide semiconductor layer. Therefore, in the aspect of the present disclosure, Sn(II)O based oxide semiconductor transistor having a P type semiconductor characteristic may be formed.

Also, according to the aspect of the present disclosure, the first thin film transistor that includes a first active layer having an Sn(II)O based oxide and the second thin film transistor that includes a second active layer having an $Sn(IV)O_2$ based oxide are provided. As a result, according to the aspect of the present disclosure, the first thin film transistor may be realized as a thin film transistor having P type semiconductor characteristic, and the second thin film transistor may be realized as a thin film transistor having an N type semiconductor characteristic.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. Thus, the above aspects are to be considered in all respects as illustrative and not restrictive. The scope of the disclosure should be determined by reasonable interpretation of the appended claims and all change which comes within the equivalent scope of the disclosure are included in the scope of the disclosure.

What is claimed is:

1. A method for manufacturing a thin film transistor, the method comprising:
   forming an active layer, the active layer being formed of an Sn(IV)02 based oxide semiconductor layer having N type semiconductor characteristic;
   forming a gate electrode;
   forming a gate insulating film, the gate insulating film being between the gate electrode and the active layer;
   forming a reactive metal layer, the reactive metal layer contacting a surface of the active layer; and
   heat-treating the active layer and the reactive metal layer simultaneously in a single process step to form the active layer as an Sn(II)0 based oxide semiconductor layer and to form the reactive metal layer as a metal oxide layer.

2. The method of claim 1, further comprising:
forming a source electrode in contact with a first portion of the active layer; and
forming a drain electrode in contact with a second portion of the active layer.

3. The method of claim 1, wherein the metal oxide layer is an electrically insulating layer.

4. The method of claim 1, wherein the metal oxide layer is formed of an aluminum oxide, a titanium oxide, a thallium oxide, a tantalum oxide, or a molybdenum-titanium oxide.

5. The method of claim 1, wherein the metal oxide layer is disposed on an upper surface of the active layer.

6. The method of claim 1, wherein the source electrode and the drain electrode are in contact with the metal oxide layer.

7. The method of claim 1, wherein the active layer is disposed over the gate electrode.

8. The method of claim 1, wherein the gate electrode is disposed on the active layer.

9. The method of claim 1, wherein the reactive metal layer is converted to the metal oxide layer through a reduction reaction in the active layer and an oxidation reaction in the reactive metal layer.

10. The method of claim 1,
wherein a portion of the metal oxide layer is removed by etching to make a portion of the upper surface of the active layer not covered with the metal oxide layer.

11. The method of claim 10,
wherein the portion of the upper surface of the active layer not covered with the metal oxide layer become a conductive area.

12. The method of claim 11,
wherein at least one of the source electrode and the drain electrode is in contact with the conductive area of the active layer.

13. The method of claim 1, wherein the metal oxide layer is disposed below the active layer.

14. The method of claim 1, wherein the Sn(II)O based oxide semiconductor layer comprises at least one of SnO, Sn-M-$O_x$, Sn-M1-M2-$O_x$ and M-doped SnO, wherein each of M, M1 and M2 is W, B, Nb, Al, Ga, Pb or Si, respectively.

15. The method of claim 1, wherein the reactive metal layer is formed of aluminum, titanium, thallium, molybdenum, tantalum or a titanium alloy.

16. The method of claim 1, wherein the Sn(IV)$O_2$ based oxide semiconductor layer comprises at least one of $SnO_2$, Sn-M-$O_x$, Sn-M1-M2-$O_x$ and M-doped $SnO_2$,
where each of M, M1 and M2 is W, B, Nb, Al, Ga, Pb or Si, respectively.

17. A method for manufacturing a display device, the method comprising:
forming a first active layer and a second active layer, the first active layer and the second active layer being formed of an Sn(IV)02 based oxide semiconductor layer having N type semiconductor characteristic;
forming a first gate electrode overlapping the first active layer;
forming a second gate electrode overlapping the second active layer;
forming a gate insulating film, the gate insulating film being between the first gate electrode and the first active layer, and between the second gate electrode and the second active layer;
forming a reactive metal layer, the reactive metal layer contacting a surface of the first active layer; and
heat-treating the first active layer, the second active layer and the reactive metal layer simultaneously in a single process step to form the first active layer as an Sn(II)0 based oxide semiconductor layer and to form the reactive metal layer as a metal oxide layer.

18. The method of claim 17, wherein the metal oxide layer is disposed on an upper surface of the first active layer.

19. The method of claim 17, wherein the metal oxide layer is disposed on a lower surface of the first active layer.

20. The method of claim 17, wherein the reactive metal layer is converted to the metal oxide layer through a reduction reaction in the first active layer and an oxidation reaction in the reactive metal layer.

* * * * *